(12) United States Patent
Gorlow

(10) Patent No.: US 10,924,078 B2
(45) Date of Patent: Feb. 16, 2021

(54) INVERSION OF DYNAMIC RANGE CONTROL

(71) Applicant: Dolby International AB, Amsterdam Zuidoost (NL)

(72) Inventor: Stanislaw Gorlow, Stockholm (SE)

(73) Assignee: Dolby International AB, Amsterdam Zuidoost (NL)

( * ) Notice: Subject to any disclaimer, the term of this patent is extended or adjusted under 35 U.S.C. 154(b) by 0 days.

(21) Appl. No.: 16/498,367

(22) PCT Filed: Mar. 19, 2018

(86) PCT No.: PCT/EP2018/056840
§ 371 (c)(1),
(2) Date: Sep. 26, 2019

(87) PCT Pub. No.: WO2018/177787
PCT Pub. Date: Oct. 4, 2018

(65) Prior Publication Data
US 2020/0067476 A1 Feb. 27, 2020

Related U.S. Application Data

(60) Provisional application No. 62/479,392, filed on Mar. 31, 2017.

(30) Foreign Application Priority Data

Mar. 31, 2017 (EP) .................................... 17164145

(51) Int. Cl.
*H03G 7/00* (2006.01)
*H03G 5/00* (2006.01)
(Continued)

(52) U.S. Cl.
CPC ........... *H03G 7/007* (2013.01); *G10L 19/167* (2013.01); *H03G 9/06* (2013.01)

(58) Field of Classification Search
CPC .......... H03G 9/025; H03G 11/00; H03G 9/18; G10H 1/16; G10H 2210/315
(Continued)

(56) References Cited

U.S. PATENT DOCUMENTS 5,832,444 A 11/1998 Schmidt
6,920,188 B1 7/2005 Walker
(Continued)

FOREIGN PATENT DOCUMENTS

EP 0855793 A2 7/1998
FR 3031638 A1 7/2016
(Continued)

OTHER PUBLICATIONS

European Telecommunication Standards Institute (ETSI) TS 101. 154 Version 2.2.1, Jun. 2015.
(Continued)

*Primary Examiner* — George C Monikang

(57) ABSTRACT

The present disclosure relates to a method of determining parameters for use by a first dynamic range control, DRC, model. The method comprises feeding a first audio signal to a second DRC model and receiving a second audio signal from the second DRC model, the second audio signal being a dynamic range controlled version of the first audio signal, rule-based selecting one or more pairs of samples of the first audio signal and corresponding samples of the second audio signal, and determining parameters of a first set of parameters among the parameters for use by the first DRC model based on the one or more selected pairs of samples. The present disclosure further relates to a method of reversing DRC of a dynamic range controlled audio signal and to a (Continued)

method of declipping a clipped audio signal that has been clipped by a DRC model. The present disclosure yet further relates to corresponding apparatus and computer-readable media.

18 Claims, 14 Drawing Sheets

(51) Int. Cl.
*H03G 3/20* (2006.01)
*G10L 19/16* (2013.01)
*H03G 9/06* (2006.01)

(58) Field of Classification Search
USPC .................................................. 381/104–107
See application file for complete search history.

(56) References Cited

U.S. PATENT DOCUMENTS

| | | | |
|---|---|---|---|
| 7,848,531 | B1 | 12/2010 | Vickers |
| 8,229,125 | B2 | 7/2012 | Short |
| 8,352,052 | B1 | 1/2013 | Green |
| 8,510,361 | B2 | 8/2013 | Massenburg |
| 8,660,676 | B2 | 2/2014 | Aichner |
| 8,913,768 | B2 | 12/2014 | Kates |
| 8,965,774 | B2 | 2/2015 | Eppolito |
| 9,173,020 | B2 | 10/2015 | Cheng |
| 9,288,587 | B2 | 3/2016 | Ma |
| 9,401,152 | B2 | 7/2016 | Riedmiller |
| 2003/0106011 | A1 | 6/2003 | Miyauchi |
| 2006/0017597 | A1 | 1/2006 | Jaspers |
| 2006/0126865 | A1 | 6/2006 | Blamey |
| 2014/0294200 | A1 | 10/2014 | Baumgarte |
| 2014/0297291 | A1 | 10/2014 | Baumgarte |
| 2015/0104021 | A1 | 4/2015 | Riedmiller |
| 2015/0154977 | A1 | 6/2015 | Ekman |
| 2015/0294675 | A1 | 10/2015 | Hammarqvist |
| 2015/0363160 | A1 | 12/2015 | Riedmiller |
| 2016/0226462 | A1 | 8/2016 | Shefer |
| 2016/0227339 | A1 | 8/2016 | Koppens |

FOREIGN PATENT DOCUMENTS

| | | |
|---|---|---|
| WO | 2014135914 A1 | 9/2014 |
| WO | 2015035492 A1 | 3/2015 |

OTHER PUBLICATIONS

ISO/IEC 14496-3 ("MPEG-4 Audio").
Advanced Television Systems Committee (ATSC) Digital Audio Compression standard (AC-3, E-AC-3), Revision a, Document A/52:2012, Mar. 23, 2012 (Corrigendum No. 1, Dec. 17, 2012.
Avargel, Y. et al "Adaptive Nonlinear System Identification in the Short-Time Fourier Transform Domain" IEEE Transactions on Signal Processing, vol. 57, issue 10, Apr. 2009.
Fattal, R. et al "Gradient Domain High Dynamic Range Compression" Jun. 2005, ACM Transactions.
Giannoulis, D. et al "Parameter Automation in a Dynamic Range Compressor" J. Audio Eng. Soc., vol. 61, No. 10, Oct. 2013, pp. 716-726.
TS 103.190 ("AC-4"), Digital Video Broadcasting (DVB), Advanced Audio Coding (ACC) (MPEG-2 AAC Standard.
Gorlow, S. et al "Restoring the Dynamics of Clipped Audio Material by Inversion of Dynamic Range Compression" IEEE International Symposium on Broadband Multimedia Systems and Broadcasting, Jun. 25-27, 2014, pp. 1-6.
ISO/IEC 2008 MPEG-H.
ISO/IEC 23003-4 MPEG-D Dynamic Range Control (DRC).
Maddams, J. et al "An Autonomous Method for Multi-Track Dynamic Range Compression" Proc. of the 15th Int. Conference on Digital Audio Effects, York, UK, Sep. 17-21, 2012, pp. DAFX1-8.

INVERSION OF DYNAMIC RANGE CONTROL

TECHNOLOGY

Example embodiments disclosed herein generally relate to dynamic range control (e.g., dynamic range compression) or dynamic range controllers or compressors or expanders of a digital audio signal, and more specifically, to methods and systems for determining DRC parameters, for example, by employing heuristic (rule-based) and analytic techniques, and/or for reversing dynamic range control.

BACKGROUND

Dynamic range control (DRC) is a tool employed by audio engineers to map the dynamic range of an audio signal to a smaller range such as reducing the volume of loud sounds or by amplifying quiet sounds or narrowing or compressing the audio signals dynamic range. DRC is also employed to control the signal level peaks (e.g., overshoots) while ignoring the quieter audio signal samples. For example, when watching a movie, gunshot sounds might be too loud, but the dialog level might be too quiet. In such a scenario, a user is required to constantly adjust the volume to compensate for the inconsistency in loudness. In another scenario, the dynamic range of the original audio might be too large to fit a playback device (e.g., portable devices). In that scenario, DRC can be employed to adjust the loudness of these sounds automatically such that every sound can be perceived with its unique loudness considering the environment, the device, and the user's preferences for playback.

Multimedia and audio devices operate in acoustic environments which challenge playback audio quality. Some non-limiting examples of multimedia and audio devices include all sorts of personal devices such as smart phones, tablets and other personal music devices as well as smart televisions and set-top boxes. As such, dynamic range and loudness control are important to playback audio quality in multimedia and audio devices. DRC may be employed to avoid the need to continuously adjust the volume of devices to compensate for the differing loudness characteristics of devices. DRC could also be employed to improve a movie's dialog which might be perceived as unintelligible due to a noisy listening environment to avoid the need to manually control the dynamic range and loudness. Another typical scenario where DRC could be employed is in a movie in which the sound level of the loud segments is annoyingly high and the softer parts are just loud enough, or a movie in which the soft parts are inaudible when loud parts are at a reasonable level.

In signal processing, dynamic range controllers (in what follows referred to as "controllers") are typically designed by configuring non-linear and time-variant filters. Such controllers first detect an input level to derive a control signal and then adaptively process the input signal. As can be appreciated by those skilled in the art, DRC is often used by audio engineers and content creators in post-production, broadcast, audio codecs, and live production to reduce distortion and maximize playback level. For example, an audio codec might generate a set of DRC parameters and attach it to an audio recording as metadata. These metadata can then be applied to a recording, if desired, at the receiver.

Accordingly, throughout this disclosure "DRC" shall refer to dynamic range control which encompasses dynamic range compression, dynamic range expansion, limiting, de-limiting, clipping, and de-clipping of an audio signal.

In some scenarios, it might be desirable to be able to reproduce the DRC behavior mastered by a sound engineer but with a different DRC model to allow the user to determine whether to apply the original DRC model or to employ a different DRC model. The more pertinent scenario is where the user does not have access to the model employed by the sound engineer, but still wishes to reproduce the same effect with a different model. For example, an audio engineer might have a favorite DRC model that he/she has used for decades. The audio engineer could achieve largely the same compression effect using a different DRC model that contains different parameters (e.g., MPEG-D DRC metadata).

Moreover, multi-media or audio content may be subjected to several different compressors (e.g., different DRC models in tandem) which can severely degrade an audio recording's playback quality due to heavy compression in some cases or by causing artifacts (e.g., by limiting, clipping, etc.) resulting in an over-compressed audio recording. Although in certain music genres, such as metal, over-compression can be a desired artifact, it would be desirable to be able to reverse such over compression, or DRC in general.

For example, dynamic range expansion methods have been developed to restore the dynamic range to some extent. These solutions, however, are not a true inversion of dynamic range compression. In addition, most known DRC methods can only prevent the signal from limiting and clipping, but are not suited for delimiting or declipping a limited or clipped audio signal.

Finally, as mentioned above, dynamic range controllers are typically configured using non-linear and time-variant filters which are dependent on the input signal level (or the level of an externally fed signal). Such filters are difficult to invert to reclaim the original signal.

Therefore, there is a need for an ability to restore or alter an original signal's dynamic range, for example, by declipping or delimiting a clipped or limited signal. There is a further need for an ability to estimate the DRC model and its parameters when they are unknown, for example, for translating the DRC parameters of one model to the DRC parameters of a different model, or for reversing DRC that has been applied to an audio signal. Thus, there is also a need for any ability for translating the DRC parameters of one model to the DRC parameters of a different model. In other words, there is a need for an ability to reproduce the behavior of an unknown DRC model using a desired DRC model by finding the model parameters for the desired DRC model that can generate a replica of the signal produced by the unknown DRC model.

SUMMARY

In view of these needs, the present disclosure proposes methods of determining parameters for use by a DRC model, methods of reversing DRC, methods of declipping a clipped audio signal, corresponding apparatus, and corresponding computer-readable storage media, having the features of the respective independent claims.

An aspect of the disclosure relates to a method of determining (e.g., estimating) parameters (e.g., a set of parameters) for use by a first DRC model (e.g., applied by a DRC processor or DRC system). More specifically, the method is a method of determining values of the parameters for use by the first DRC model. The method may include feeding a first audio signal to a second DRC model (e.g., applied by a DRC processor or DRC system) and receiving a second audio signal from the second DRC model. The second audio signal may be a dynamic range controlled version of the first audio signal. The method may aim at determining the parameters such that the first DRC model, when using the determined parameters, approximates the second DRC model. The first DRC model may be a known DRC model, and the second DRC model may be an unknown DRC model (that may or may not be identical to the first DRC model). The method may further include rule-based (e.g., based on heuristics) selecting one or more pairs of samples of the first audio signal (e.g., in the logarithmic domain) and corresponding samples of the second audio signal (e.g., in the logarithmic domain). That is, each pair of samples may include a sample of the first audio signal and a corresponding sample of the second audio signal. The method may further include determining (e.g., estimating) parameters of a first set of parameters among the parameters for use by the first DRC model based on the one or more selected pairs of samples. The first set of parameters may be linear operation parameters of the first DRC model, for example. The method may further include converting the first audio signal and the second audio signal to the logarithmic domain. Accordingly, the proposed method provides for an efficient determination of the DRC parameters for use by the first DRC model. Thereby, the DRC parameters can be determined even in decoders where there is no access to DRC metadata in the encoder or when the transmitted DRC metadata cannot be processed by the DRC model in the decoder. In general, the proposed method can be used to transform or generate appropriate DRC metadata in the decoder. The determined DRC parameters can then be used for reversion of DRC, for example, or for simulating the behavior of the second DRC model by using the first DRC model with the determined parameters.

In embodiments, the method may further include determining a second set of parameters among the parameters for use by the first DRC model. The second set of parameters may include the remaining ones of the parameters for use by the first DRC model that are not contained in the first set of parameters. Determining the second set of parameters may involve involves repeatedly feeding a third audio signal to the first DRC model using the determined parameters of the first set of parameters. Said determining may further involve, for each resulting audio signal received from the first DRC model, comparing the resulting audio signal received from the first DRC model to a reference audio signal and adjusting the parameters of the second set of parameters to minimize a distance function between the resulting audio signal received from the first DRC model to the reference audio signal. The reference audio signal may be obtained by feeding the third audio signal to the second DRC model.

In embodiments, the rule-based selecting the one or more pairs of samples may involve at least one of: selecting a pair of samples that has an extremal (e.g., maximum) value of a difference between a value of the sample of the second audio signal in the pair and a value of the sample of the first audio signal in the pair (e.g., in the logarithmic domain), selecting a pair of samples for which the value of the sample of the first audio signal in the pair has a value below a first threshold (e.g., has a minimum value among the samples of the first audio signal, for example, in the logarithmic domain), selecting a pair of samples for which the value of the sample of the first audio signal in the pair has a value above a second threshold (e.g., has a maximum value among the samples of the first audio signal, for example, in the logarithmic domain), and selecting a pair of samples, which is that pair of samples that has the maximum value of the sample of the first audio signal for which a variable gain portion is zero.

In embodiments, the first DRC model may be a soft-knee DRC model or a hard-knee DRC model. The first DRC model may be defined by a control value (e.g., control signal) that is applied (e.g., by addition in the logarithmic domain, or by multiplication in the linear domain) to an envelope (e.g., samples of an envelope) of an input audio signal. Further, the control value may include a constant gain portion and a variable gain portion. The constant gain function may be a make-up gain of the first DRC model, for example.

In embodiments, the rule-based selecting the one or more pairs of samples may involve selecting a first pair of samples that has an extremal (e.g., maximum) value of a difference between a value of the sample of the second audio signal in the pair and a value of the sample of the first audio signal (or the envelope thereof) in the pair (e.g., in the logarithmic domain). The determining the parameters of the first set of parameters may involve determining the constant gain portion based on said extremal value (e.g., as said extremal value).

In embodiments, the variable gain portion may include a static gain function (e.g., a piece-wise defined static gain function). The aforementioned variable gain portion may be given by a smoothed (e.g., time-smoothed) gain function that is obtained, for each sample of the envelope of the input audio signal, as a weighted sum of the static gain function and a value of the smoothed gain function for the preceding sample of the envelope of the input audio signal. Thus, the smoothed gain function may be said to be formed as a moving average. The static gain function may have a first linear portion (e.g., first linear segment) below a knee value (e.g., threshold value) and a second linear portion (e.g., second linear segment) above the knee value. The rule-based selecting the one or more pairs of samples may involve selecting a second pair of samples for which the value of the sample of the first audio signal (or the envelope thereof) in the pair has a value below a first threshold (e.g., has a minimum value among the samples of the first audio signal, for example, in the logarithmic domain), and selecting a third pair of samples for which the value of the sample of the first audio signal (or the envelope thereof) in the pair has a value above a second threshold (e.g., has a maximum value among the samples of the first audio signal, for example, in the logarithmic domain). Further, the determining the parameters of the first set of parameters may involve calculating a first slope of said first linear portion based on the second pair of samples. The determining the parameters of the first set of parameters may further involve calculating a second slope of said second linear portion based on the third pair of samples. The determining the parameters of the first set of parameters may yet further involve determining the knee value based on the first slope and the second slope. The determining the parameters of the first set of parameters may yet further involve determining a parameterization of the first linear portion based on the second pair of samples and determining a parameterization of the second linear portion based on the third pair of samples, and determining the knee value based on the parameterization of the first linear portion and the parameterization of the second linear portion, for example, by determining an intersection point (that may be imaginary) between the first linear portion and the second linear portion, for example, by numeric extrapolation of the first and second linear portions.

In embodiments, the method may further include determining (e.g., estimating) parameters of a second set of parameters among the parameters for use by the first DRC model based on the one or more selected pairs of samples. The second set of parameters may include the remaining ones of the parameters for use by the first DRC model that are not contained in the first set of parameters. For example, the second set of parameters may include the non-linear operation parameters of the first DRC model. The rule-based selecting the one or more pairs of samples may involve selecting a fourth pair of samples, which is that pair of samples that has the maximum value of the sample of the first audio signal (or the envelope thereof) for which the variable gain portion is (still) zero (e.g., for which the difference between the value of the sample of the second audio signal in the pair and the sample of the first audio signal in the pair is given by the determined constant gain portion). Further, the determining the parameters of the second set of parameters may involve determining a knee width based on the value of the sample of the first audio signal in the fourth pair of samples. The knee width may be zero, for example, if the value of the sample of the first audio signal in the fourth pair of samples is (substantially) equal to the knee value (threshold value).

In embodiments, the variable gain portion may be given by a smoothed gain function that is obtained, for each sample of the first audio signal, as a weighted sum of the static gain function and a value of the smoothed gain function for the preceding sample of the first audio signal. Further, the rule-based selecting the one or more pairs of samples may involve selecting a fifth pair of samples for which the value of the sample of the first audio signal (or the envelope thereof) is larger than the knee value and for which the value of the smoothed gain function is substantially equal to the value of the smoothed gain function for the preceding sample of the first audio signal. The determining the parameters of the second set of parameters may involve determining the second slope based on the value of the sample of the first audio signal (or the envelope thereof) in the fifth pair of samples and the value of the smoothed gain function for the sample of the first audio signal in the fifth pair of samples.

In embodiments, the parameters for use by the first DRC model may include at least one (e.g., all) of a make-up gain, a knee value, a knee width, a compression ratio, an attack time constant, and a release time constant. The make-up gain may be the constant gain portion. The first set of parameters may include at least one (e.g., all) of the make-up gain and the knee value. The second set of parameters may include at least one (e.g., all) of the knee width, the compression ratio, the attack time constant, and the release time constant.

In embodiments, the rule-based selecting the one or more pairs of samples may involve selecting a sixth pair of samples for which the value of the smoothed gain function for the preceding sample of the first audio signal is substantially zero and for which the value of the smoothed gain function is smaller than the value of the smoothed gain function for the preceding sample of the first audio signal. Further, the determining the parameters of the second set of parameters may involve determining a first smoothing factor (e.g., an attack smoothing factor that may be related to an attack time constant) based on the value of the static gain function for the sample of the first audio signal in the sixth pair of samples and the value of the smoothed gain function for the sample of the first audio signal in the sixth pair of samples. The attack smoothing factor (that may be related to the attack time constant) may be used for obtaining the smoothed gain function if the absolute value of the static gain function for the present sample is larger than the absolute value of the smoothed gain function for the preceding sample.

In embodiments, the rule-based selecting the one or more pairs of samples may involve selecting a seventh pair of samples for which the value of the envelope of the first audio signal is larger than or equal to the knee value and the static gain function for the sample of the first audio signal is larger than or equal to the value of the smoothed gain function for the preceding sample of the first audio signal. Further, the determining the parameters of the second set of parameters may involve determining a second smoothing factor (e.g., a release smoothing factor that may be related to a release time constant) based on the value of the static gain function for the sample of the first audio signal in the seventh pair of samples, the value of the smoothed gain function for the sample of the first audio signal in the seventh pair of samples, and the value of the smoothed gain function for the preceding sample of the first audio signal. The release smoothing factor (that may be related to the release time constant) may be used for obtaining the smoothed gain function if the absolute value of the static gain function for the present sample is smaller than the absolute value of the smoothed gain function for the preceding sample.

In embodiments, a pilot signal may be used as the first audio signal. The pilot signal may include at least one nonnegative envelope value below a knee value of the first DRC model. The pilot signal may further include at least one envelope value that is equal to the knee value. The pilot signal may further include an envelope signal with a plateau above the knee value, wherein a duration of the plateau is longer than an attack time constant of the first DRC model. The pilot signal may further include a segment with steadily increasing envelope values. The pilot signal may yet further include a segment with steadily decreasing envelope values.

In embodiments, the method may further include determining (e.g., estimating) a second set of parameters among the parameters for use by the first DRC model. The second set of parameters may include the remaining ones of the parameters for use by the first DRC model that are not contained in the first set of parameters. The determining the second set of parameters may involve minimizing a distance function between a dynamic range controlled audio signal output by the first DRC model and a reference audio signal.

In embodiments, the method may further include determining (e.g., estimating) a second set of parameters among the parameters for use by the first DRC model. The second set of parameters may include the remaining ones of the parameters for use by the first DRC model that are not contained in the first set of parameters. The determining the second set of parameters may involve feeding a third audio signal to the second DRC model and receiving a fourth audio signal from the second DRC model. The fourth audio signal may be a dynamic range controlled version of the third audio signal. The determining the second set of parameters may further involve repeatedly feeding the third audio signal to the first DRC model and receiving a fifth audio signal from the first DRC model. The fifth audio signal may be a dynamic range controlled version of the third audio signal. The determining the second set of parameters may yet further involve, in the repeatedly feeding the third audio signal to the first DRC model, using the determined parameters of the first set of parameters and adjusting the parameters of the second set of parameters to minimize a distance function between the fourth audio signal and the fifth audio signal.

In embodiments, the method may further include reversing the DRC (e.g., dynamic range compression, dynamic range limiting, dynamic range clipping) of a dynamic range controlled audio signal by estimating an input audio signal that would yield the dynamic range controlled audio signal when being fed to the first DRC model using the determined parameters for use by the first DRC model. The first DRC model may be defined by a control value (e.g., control signal) that is applied (e.g., added, for example, in the logarithmic domain) to an envelope (e.g., to samples of an envelope) of the input audio signal. The control value may include a static gain function. The reversing the DRC of the dynamic range controlled audio signal may involves receiving, as input, the dynamic range controlled audio signal. The reversing the DRC of the dynamic range controlled audio signal may further involve, for each sample of the dynamic range controlled signal (e.g., in the logarithmic domain), determining a characteristic function for the static gain function. The characteristic function for the static gain function may be a polynomial function of the envelope of the input audio signal and may depend on one or more of the determined parameters for use by the first DRC model. Said reversing may further include, for each sample of the dynamic range controlled signal, determining the envelope of the input audio signal based on the characteristic function. The method may further include determining the value of the sample of the input audio signal based on the determined envelope, and outputting the determined value of the sample of the input audio signal. That is, the method may further include outputting the determined (estimated) input audio signal. Accordingly, this embodiment can estimate the DRC parameters and other corresponding metadata relating to the chain of DRC processors to reverse (e.g., invert) the DRC and to restore the dynamic range of the original waveform.

In embodiments, the static gain function may be a piecewise defined static gain function. The reversing the DRC of the dynamic range controlled audio signal may further include, for each sample of the dynamic range controlled signal (e.g., in the logarithmic domain), estimating an envelope of the input audio signal (e.g., in the logarithmic domain). Said reversing may further include, for each sample of the dynamic range controlled signal, determining, based on the estimated envelope, a (e.g., relevant, applicable) piece of the static gain function that relates to the estimated envelope. The characteristic function for the static gain function may be a characteristic function for the determined piece of the static gain function.

Another aspect of the disclosure relates to a method of declipping a clipped audio signal that has been clipped by a DRC model. The method may include receiving the clipped audio signal. The method may further include determining parameters of the DRC model that have been used for clipping the clipped audio signal. This may be done in the manner described above, for example, based on selected pairs of samples, or using a hybrid approach. The method may further include increasing the dynamic range of the clipped audio signal (e.g., declipping) based on the determined parameters of the DRC model. This may result in restoring (or at least approximating) the original waveform of the clipped audio signal before clipping. This increase of dynamic range may proceed along the lines of the DRC reversion described in the next aspect.

Another aspect of the disclosure relates to a method for reversing DRC (e.g., dynamic range compression) of a dynamic range controlled audio signal by estimating an input audio signal that would yield the dynamic range controlled audio signal when being fed to a (e.g., given, known) DRC model using a (e.g., given, known) set of parameters. The DRC model may be a soft-knee DRC model or a hard-knee DRC model. Further, the DRC may be defined by a control value that is applied (e.g., added, for example, in the logarithmic domain) to an envelope (e.g., to samples of an envelope) of the input audio signal. The control value may include a static gain function. The control value may include a constant gain portion and a variable gain portion. The variable gain portion may include the static gain function. For example, the variable gain portion may be a smoothed (e.g., time-smoothed) gain function that is obtained, for each sample of the input audio signal, as a weighted sum of the static gain function and the smoothed gain function for the preceding sample of the input audio signal. In this case, the characteristic function for the static gain function may further depend on the smoothed gain function for the preceding sample. The method may include receiving, as inputs, the dynamic range controlled audio signal and the set of parameters of the DRC model. The method may further include, for each sample of the dynamic range controlled signal (e.g., in the logarithmic domain), determining a characteristic function for the static gain function. The characteristic function for the static gain function may be a polynomial function of the envelope of the input audio signal and may depend on one or more of the set of parameters of the DRC model. The method may further include, for each sample of the dynamic range controlled signal (e.g., in the logarithmic domain), determining the envelope of the input audio signal based on the characteristic function. The method may further include converting the dynamic range controlled audio signal to the logarithmic domain. The method may further include determining the value of the sample of the input audio signal based on the determined envelope, and outputting the determined value of the sample of the input audio signal. That is, the method may further include outputting the determined (estimated) input audio signal. Configured as such, the proposed method enables to reverse the DRC (or DRCs) applied on a recording when the DRC model and its parameters are known. Thereby, the dynamic range of the original waveform can be restored.

In embodiments, the static gain function may be a piecewise defined static gain function. Further, the method may include, for each sample of the dynamic range controlled signal (e.g., in the logarithmic domain), estimating an envelope of the input audio signal (e.g., in the logarithmic domain). The method may yet further include, for each sample of the dynamic range controlled signal (e.g., in the logarithmic domain), determining, based on the estimated envelope, a (e.g., relevant, applicable) piece of the static gain function that relates to the estimated envelope. The characteristic function for the static gain function may be a characteristic function for the determined piece of the static gain function. That is, the method may include determining a characteristic function for the determined piece of the static gain function. Further, the characteristic function for the determined piece of the static gain function may be a polynomial function of the envelope of the input audio signal and may depend on one or more of the set of parameters of the DRC model.

In embodiments, the control value may include a constant gain portion and a variable gain portion. The variable gain portion may be given by a smoothed gain function that is obtained, for each sample of the input audio signal, as a weighted sum of the piece-wise defined static gain function and a value of the smoothed gain function for the preceding sample of the input audio signal. The estimating the envelope of the input audio signal may involve, for each sample of the dynamic range controlled signal, estimating the envelope based on the value of the present sample, a value of the smoothed gain function for the preceding sample, and one or more of the set of parameters of the DRC model. Alternatively, the envelope may be estimated by linear prediction from the determined envelopes for the two (or more) preceding samples of the dynamic range controlled signal, for example, in the logarithmic domain.

In embodiments, the method may further include, for each sample of the dynamic range controlled audio signal, estimating a smoothing factor (e.g., related to a time constant) based on the value of the present sample, the smoothed gain function for the preceding sample, and one or more of the set of parameters of the DRC model. The smoothing factor may have one of two values that are among the set of parameters of the DRC model, for example, an attack smoothing factor related to an attack time constant and a release smoothing factor related to a release time constant.

In embodiments, the DRC model may be defined by, for each sample of the dynamic range controlled audio signal, $Y(n)=V(n)+\alpha \cdot F(n)+(1-\alpha) \cdot G(n-1)+M$, with $F(n)=-S/(2W) \cdot (V(n)-(T-W/2))^2$ for $T-W/2<V(n)<T+W/2$, with $F(n)=-S \cdot (V(n)-T)$ for $V(n) \geq T+W/2$, and with $F(n)=O$ for $V(n) \leq T-W/2$, where $Y(n)$ is a sample of the dynamic range controlled audio signal, $V(n)$ is a sample of the envelope of the input audio signal, $\alpha$ is the smoothing factor, $G(n-1)$ is the smoothed gain function for the preceding sample of the dynamic range controlled audio signal, $T$ is a knee value of the DRC model, $W$ is a knee width of the DRC model, $S$ is a slope related to a compression ration of the DRC model, and $M$ is the constant gain portion. For the estimated envelope $\hat{V}(n)$ ($\hat{V}(n)$ being understood to indicate $\hat{V}(n)$) of the input audio signal satisfying $T-W/2<\hat{V}(n)<T+W/2$, the smoothing factor may be determined to have a value relating to an attack time constant among the set of parameters of the DRC model if $-S/(2W) \cdot [Y(n)-G(n-1)-M-(T-W/2)]^2 < G(n-1)$, and to have a value relating to a release time constant among the set of parameters of the DRC model otherwise. For the estimated envelope $\hat{V}(n)$ of the input audio signal satisfying $\hat{V}(n) \geq T+W/2$, the smoothing factor may be determined to have the value relating to the attack time constant if $-S \cdot [Y(n)-G(n-1)-M-T]<G(n-1)$, and to have the value relating to the release time constant otherwise.

In embodiments, the DRC model may be defined by, for each sample of the dynamic range controlled audio signal, $Y(n)=V(n)+\alpha \cdot F(n)+(1-\alpha) \cdot G(n-1)+M$, with $F(n)=-S/(2W) \cdot (V(n)-(T-W/2))^2$ for $T-W/2<V(n)<T+W/2$, with $F(n)=-S \cdot (V(n)-T)$ for $V(n) \geq T+W/2$, and with $F(n)=O$ for $V(n) \leq T-W/2$, where $Y(n)$ is a sample of the dynamic range controlled audio signal, $V(n)$ is a sample of the envelope of the input audio signal, $a$ is the smoothing factor, $G(n-1)$ is the smoothed gain function for the preceding sample of the dynamic range controlled audio signal, $T$ is a knee value of the DRC model, $W$ is a knee width of the DRC model, $S$ is a slope related to a compression ration of the DRC model, and $M$ is the constant gain portion. The characteristic function for the determined piece of the static gain function may be given by $Z_1(V)=a \cdot V^2(n)+b \cdot V(n)+c$, with $a=-(\alpha S)/(2W)$, $b=1+(\alpha S)/W \cdot (T-W/2)$, and $c=-(\alpha S)/(2W) \cdot (T-W/2)^2+(1-\alpha) \cdot G(n-1)+M-Y(n)$, for the estimated envelope $\hat{V}(n)$ of the input audio signal satisfying $T-W/2<\hat{V}(n)<T+W/2$. The characteristic function for the determined piece of the static gain function may be given by $Z_2(V)=(1-\alpha \cdot S) \cdot V(n)+\alpha \cdot S \cdot T+(1-\alpha) \cdot G(n-1)+M-Y(n)$, for the estimated envelope $\hat{V}(n)$ of the input audio signal satisfying $\hat{V}(n) \geq T+W/2$.

Another aspect of the disclosure relates to an apparatus including a processor and a memory coupled to the processor. The memory may store instructions that are executable by the processor. The processor may be configured to perform (e.g., when executing the aforementioned instructions) the method of any one of the aforementioned aspects or embodiments.

Yet another aspect of the disclosure relates to a computer-readable storage medium having stored thereon instructions that, when executed by a processor, cause the processor to perform the method of any one of the aforementioned aspects or embodiments.

It should be noted that the methods and apparatus including its preferred embodiments as outlined in the present document may be used stand-alone or in combination with the other methods and systems disclosed in this document. Furthermore, all aspects of the methods and apparatus outlined in the present document may be arbitrarily combined. In particular, the features of the claims may be combined with one another in an arbitrary manner.

DESCRIPTION OF DRAWINGS

Through the following detailed description regarding the accompanying drawings, the features and advantages of the example embodiments will become more comprehensible. In the drawings, several embodiments will be illustrated in an example and non-limiting manner, wherein.

Throughout the drawings, the same or corresponding reference symbols refer to the same or corresponding parts.

DESCRIPTION OF EXAMPLE EMBODIMENTS

Figure 1A:
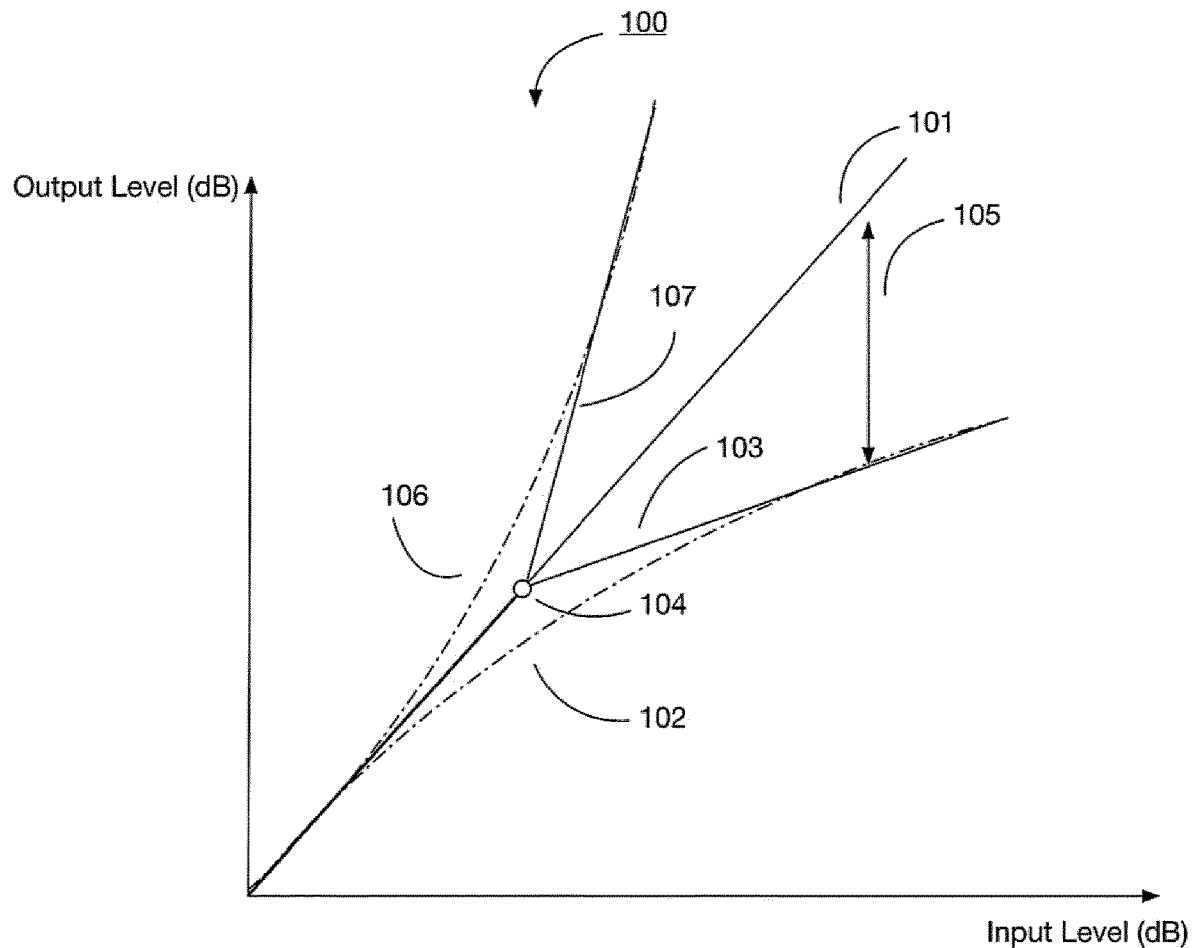
FIG. 1A and FIG. 1B are graphical illustrations of a static non-linearity of a DRC system which is referred to as the DRC curve.

Principles of the present invention will now be described with reference to various example embodiments illustrated in the drawings. It should be appreciated that depiction of these embodiments is only to enable those skilled in the art to better understand and further implement the present invention, and is not intended to limit the scope of the present invention in any manner.

Example embodiments disclosed herein describe techniques for inverting the dynamic range of a recording given none or some dynamic range control (DRC) model parameters. That is, in one example embodiment, a DRC inversion technique may be employed where the model parameters are known. In another example embodiment, the DRC technique can also be employed where the DRC model parameters are not known by employing an estimation of the DRC model parameters. That is, a heuristic (e.g., rule-based) technique can be employed where the predetermined DRC model is known that estimates the model parameters. In the alternative scenario, where the DRC model is not known a non-heuristic parameter identification technique can be employed. The non-heuristic parameter identification technique can be employed where the DRC model differs from the predetermined DRC model. In this scenario, both the DRC model and its parameters are approximated, i.e. the parameters of the predetermined model are adjusted in such a way that the generated output best fits the output of the unknown model subject to an optimization criterion.

The DRC inversion techniques described herein have several advantages. For example, the DRC inversion technique can be employed to restore the dynamic range of heavily compressed recordings. Moreover, example embodiments disclosed herein can be featured as a DRC inversion offered in the encoder and decoder stages of next-generation codecs such as MPEG-D DRC, MPEG-H, and AC-4. Furthermore, the example embodiments disclosed herein can be used as a DRC inversion plugin for remastering audio recording in the post production. Furthermore, example embodiments disclosed herein can be employed to transform the DRC metadata from an arbitrary codec to another industry standard codec's DRC metadata, such as MPEG-D DRC.

In one example embodiment, signal peaks or dialnorm metadata can be generated on the encoder. These metadata can then be transmitted to the decoder to perform inverse DRC on a signal if desired.

In another embodiment, an audio signal could have been compressed before encoding. The present embodiment can be included in the decoder to restore the dynamic range using the encoded bitstream when decoding the signal.

In Hi-Fi audio systems, it might be desired to restore the dynamic range since many audio signals are compressed on purpose. This purposeful compression can be uncompressed on the decoder side using only the peak metadata or the dialnorm or any other audio level metadata from the encoded audio signal.

As used herein, DRC model parameters can be conveyed as DRC metadata (e.g., DRC model parameters as well as other metadata) attached to a recording. Those skilled in the art will appreciate that DRC metadata can be attached or included with recordings encoded by creators and content distributors using various industry standards. Some non-limiting examples include the Advanced Television Systems Committee (ATSC) Digital Audio Compression standard (AC-3, E-AC-3), Revision a, Document A/52:2012, Mar. 23, 2012 (Corrigendum No. 1, Dec. 17, 2012), European Telecommunication Standards Institute (ETSI) TS 101.154 Version 2.2.1, June 2015 and TS 103.190 ("AC-4"), Digital Video Broadcasting (DVB), Advanced Audio Coding (ACC) ("MPEG-2 AAC Standard") and ISO/IEC 14496-3 ("MPEG-4 Audio"), ISO/IEC 23003-4 ("MPEG-D Dynamic Range Control (DRC)", and ISO/IEC 2008 ("MPEG-H") the last three of which are both published by the International Organization for Standardization (ISO).

1. DRC Curve

To demonstrate the benefits of the example embodiment it is helpful to view a graphical representation of the DRC curve. DRC curve usually describes the static nonlinearity, while the characteristic function describes the nonlinear relation between the input and the output. A DRC curve is a graph showing the relationship between input signal level (e.g., uncompressed, de-limited, and the like.) and output signal level (e.g., compressed, limited, and the like.) as shown in FIG. 1A. This graphical representation is sometimes referred to as the DRC curve. As shown in FIG. 1A, a compressed output signal level is shown on the y-axis and an uncompressed input signal level on the x-axis. For example, in FIG. 1A, the DRC dot-dashed curve 101 depicts the output signal level increasing linearly with the slope of one with respect to the input signal level. That is the example DRC system for curve 101 does not change the input signal level. The solid line 103 denotes another DRC curve where the output signal level increases linearly with the input curve until it reaches the point 104, also known as the threshold. Once the output level reaches the values determined by 104, the output level decreases with respect to the input signal level given the ratio determined by 105. This DRC curve is also known as the downward hard-knee DRC curve due to the abrupt change in the output level. This abrupt change in the output signal level makes the effect of DRC more audible, therefore, a smoother transition is usually desired. The solid DRC curve in 107 depicts another hard-knee DRC curve like that in 103 with an upward slope. The dashed line 102 and 106 depict a soft-knee downward and upward DRC curve respectively. The upward DRC depicts expansion in the dynamic range and the downward DRC depicts compression in the dynamic range.

2. DRC Model Parameters

Example embodiments according to the present disclosure are applicable to DRC models that are soft-knee DRC models or hard-knee DRC models (both upwards- and downwards-compression). Example embodiments according to the present disclosure describe a DRC reversion (e.g., inversion) technique for such DRC models. Other example embodiments relate to parameter identification (e.g., determination, or estimation) for such DRC models. In general, such models employ the following DRC model parameters:

Make-up gain: An offset value in decibel is added (in the logarithmic domain) to a compressed signal after compression to compensate for any loss in the volume of the signal due to compression. The make-up gain may also be referred to as constant gain portion throughout the present disclosure.

Threshold value: The level in decibel at which the compression starts to kick in. Note that when the knee is soft, compression will set in already below the nominal threshold level depending on the width of the knee. The threshold value may also be referred to as knee value throughout the present disclosure.

Compression ratio: Controls the input/output ratio in decibel for when the signal goes over the threshold value.

Attack Time: The time it takes to achieve maximum gain reduction during compression. The attack time may also be referred to as attack time constant throughout the present disclosure.

Release Time: The time it takes for the signal to go back to its initial state. The release time may also be referred to as release time constant throughout the present disclosure.

Knee Width: This function controls the transition in the threshold point. For zero knee width, the model is a hard-knee DRC model. For finite knee width, the model is a soft-knee DRC model.

Further, example embodiments of the present disclosure relate to methods and apparatus for determining values of the above DRC model parameters, assuming that the DRC model detailed above and in the remainder of the present disclosure is used.

Figure 1B:
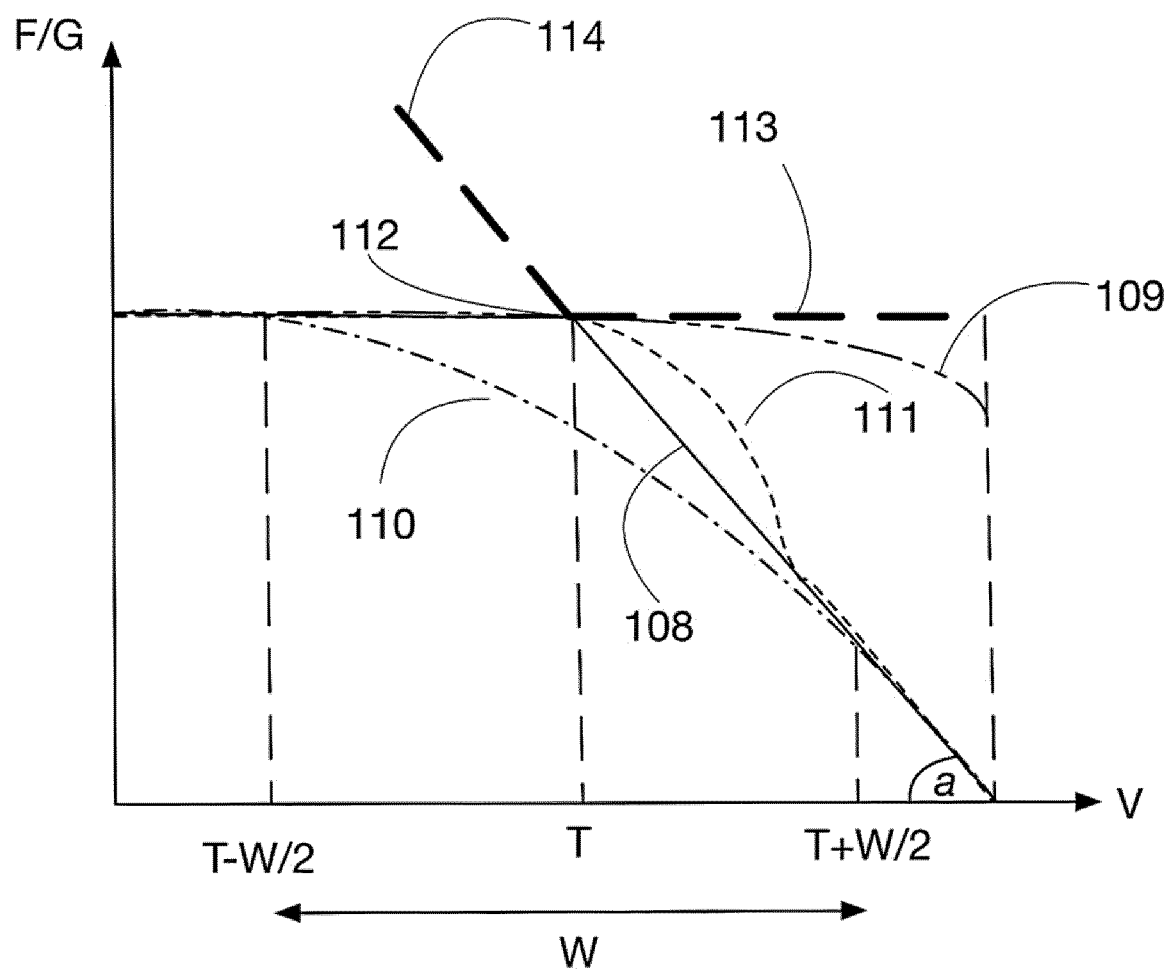

Referring to FIG. 1B, a downward compression curve (DCC) is shown. The y-axis depicts the ratio of static gain (F) over the dynamic gain (G). The x-axis depicts the envelope gain (V). The intersection 112 is the threshold denoted as T. The curve 110 depicts a soft knee DCC. The curve 108 depicts a hard knee DCC. The curve 111 depicts a hard knee DCC with short time constant like those in a peak limiter, curve 109 depicts a hard knee DCC with long time constant. W is the knee width of the DCC, F is the static gain, and G is the dynamic gain. If the peak limiter matches the assumed model in the embodiment (discussed below), the threshold value can be estimated from the static gain curve at the intersection of 113 and 114. Notice that a soft knee DCC does not have an intersection point like the one for the hard knee DCC. The threshold for soft knee DCC is below the threshold for hard knee DCC. In order to determine the threshold for the soft-knee case the right and left hand side limits are calculated and the intersection of the slopes are determined. The computational details of this section are discussed later.

For simplicity, we refer to the set of make-up gain, threshold value, compression ratio and attack and release time as θ. Dynamic range control is described below as multiplying an input signal with a control signal in the discrete-time domain as shown in Equation 1.

$$y(n)=x(n)\cdot c(n)\qquad\text{(Equation No. 1)}$$

That is, as shown in Equation 1, $y(n)$ is a dynamic range controlled (e.g., compressed) output signal, $x(n)$ is an original (e.g., uncompressed) input signal, and $c(n)$ is a control signal (control value). Needless to say, both the input signal and the output signal are audio signals. The control signal (control value) is defined as $$c(n)=m\cdot g(n)\qquad\text{(Equation No. 2)}$$

In Equation 2, m is a make-up gain parameter and $g(n)$ is a smooth (smoothed) gain function. The make-up gain is used to match the level of the output signal to the input signal since compression reduces the output level (see D. Giannoulis et al., "Digital Dynamic Range Compressor Design—A Tutorial and Analysis," Audio Engineering Society, 2012, the content of which is incorporated by reference in its entirety). Equation 2 can be written in the logarithmic or log domain as shown below:

$$C(n)=M+G(n)\qquad\text{(Equation No. 3)}$$

The make-up gain M may be referred to as constant gain portion, whereas the smooth (smoothed) gain function $G(n)$ may be referred to as variable gain portion. Then, the control value may be said to comprise (e.g., consist of) the constant gain portion and the variable gain portion.

In Equation 3, $C(n)$, M, and $G(n)$ are twenty times the logarithm of $c(n)$, m, and $g(n)$, respectively, without intended limitation. In general, $C(n)$, M, and $G(n)$ are given by a constant (which may also be one) times the logarithm of $c(n)$, m, and $g(n)$, respectively. In an example embodiment, a smooth gain function is used to attenuate the input signal level by a varied amount of gain over time and possibly over different frequency bands.

To define the smooth gain function in more detail, the following quantities must be defined first. The compressed output signal is:

$$Y(n)=V(n)+C(n)\qquad\text{(Equation No. 4)}$$

$$y(n)=x(n)\cdot c(n)=sgn(x)\cdot v(n)\cdot c(n)\qquad\text{(Equation No. 5)}$$

In Equation 4, $V(n)$ is the envelope of the uncompressed input signal and is a constant (which may also be one) times the logarithm of the absolute value of $x(n)$. For example, $V(n)$ may be obtained as shown in Equation 6:

$$V(n)=20\,\log_{10}|x(n)|\qquad\text{(Equation No. 6)}$$

In general, the output signal is obtained by applying the control value (control signal) to the input signal (or the envelope thereof). In the linear time domain, said applying may correspond to multiplying the input signal (or the envelope thereof) by the control value. in the logarithmic domain, said applying may correspond to adding the control value (in the logarithmic domain) to the input signal (or the envelope thereof). The DRC model may be said to be defined by the control value (control signal) that is applied to (the envelope of) the input signal.

In this embodiment, DRC is activated if the envelope is greater than a threshold value (knee value) as shown in Equation 7.

$$F(n)=\begin{cases}F_1(n) & \text{if } T+\frac{W}{2}>V(n)>T-\frac{W}{2}\\ F_2(n) & \text{if } V(n)\geq T+\frac{W}{2}\\ 0 & \text{Otherwise}\end{cases}\qquad\text{(Equation No. 7)}$$

In general, $F(n)$ may have a first linear portion (e.g., first linear segment) below the threshold value (knee value), for example, with gain equal to unity, and a second linear portion (e.g., second linear segment) above the threshold value (knee value). $F(n)$ may be said to be piece-wise defined.

In Equation 7, $$F_1(n) = -S \cdot \frac{\left[V(n) - \left(T - \frac{W}{2}\right)\right]^2}{2W},$$ (Equation No. 8)

$$F_2(n) = -S \cdot [V(n) - T]$$

In Equation 8, S is the slope and is defined as follows:

$$S = 1 - \frac{1}{R}$$ (Equation No. 9)

In Equation 9, R is the DRC ratio (compression ratio). F(n) is the static nonlinearity in the gain computer in the logarithmic domain. F(n) may be referred to as the static gain function throughout the present disclosure.

The smooth gain function (variable gain portion) G(n) may comprise the static gain function. For example, the smooth gain function (variable gain portion) G(n) may be calculated as below:

$$G(n) = \alpha F(n) + (1-\alpha) G(n-1)$$ (Equation No. 10)

In Equation 10, the smooth (smoothed) gain function is the weighted average of F(n) and the previous smoothed gain function value. That is, the variable gain portion is given by a smoothed (e.g., time-smoothed) gain function that is obtained, for each sample of the input signal, as a weighted sum of the static gain function and the value of the smoothed gain function for the preceding sample of the input signal. In other words, the smoothed gain function may be obtained as a moving average. α (a smoothing constant, or weight constant) is defined as follows:

$$\alpha = 1 - e^{-\frac{1}{f_s \tau}}$$ (Equation No. 11)

In Equation 11, τ is the time constant for the attack or the release time, so that α can take on two different values as shown in Equation 12.

$$\alpha = \begin{cases} \alpha_{attack} & \text{if } F(n) < G(n-1) \\ \alpha_{release} & \text{Otherwise} \end{cases}$$ (Equation No. 12)

In general, the attack smoothing factor $\alpha_{attack}$ (which is related to an attack time constant $\tau_{attack}$) is used for obtaining the smoothed gain function if the absolute value of the static gain function F(n) for the present sample n is larger than the absolute value of the smoothed gain function for the preceding sample. On the other hand, the release smoothing factor $\alpha_{release}$ (which is related to a release time constant $\tau_{release}$) is used for obtaining the smoothed gain function if the absolute value of the static gain function F(n) for the present sample n is smaller than the absolute value of the smoothed gain function for the preceding sample. Notably, in Equation No. 12, F(n) and G(n-1) are smaller than or equal to zero (since the DRC model in suit is, without intended limitation, a downward-compression model).

3. DRC Reversion (e.g., Inversion)

Figure 2:
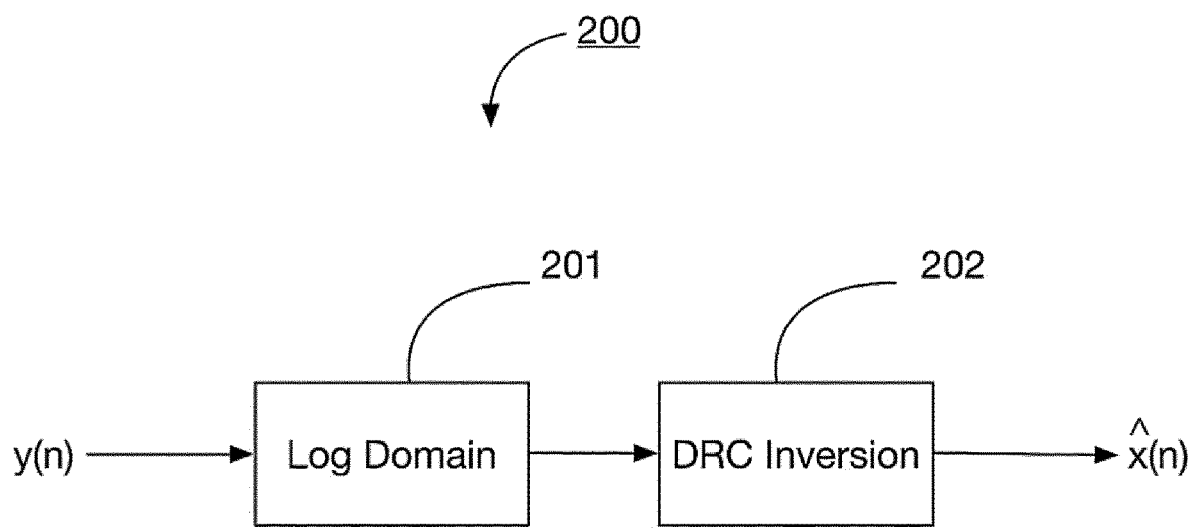
FIG. 2 is a block diagram of employing a log domain DRC inversion for uncompressing, de-limiting, or de-clipping a compressed, limited, or clipped recording in accordance with example embodiments of the present disclosure.

In one example embodiment, the DRC inversion is accomplished in the log domain. There are two main advantages of inverting the DRC in the log domain: The first advantage is that the mathematics behind the DRC inversion disclosed herein are simpler than another DRC inversion method, which directly translates into computation and storage relief. And second, there exists a closed-form solution to the inversion problem in the log domain for the DRC model under consideration. FIG. 2 depicts a high-level block diagram for removing the DRC effect 202 from a compressed recording in the log domain 201.

Figure 12:
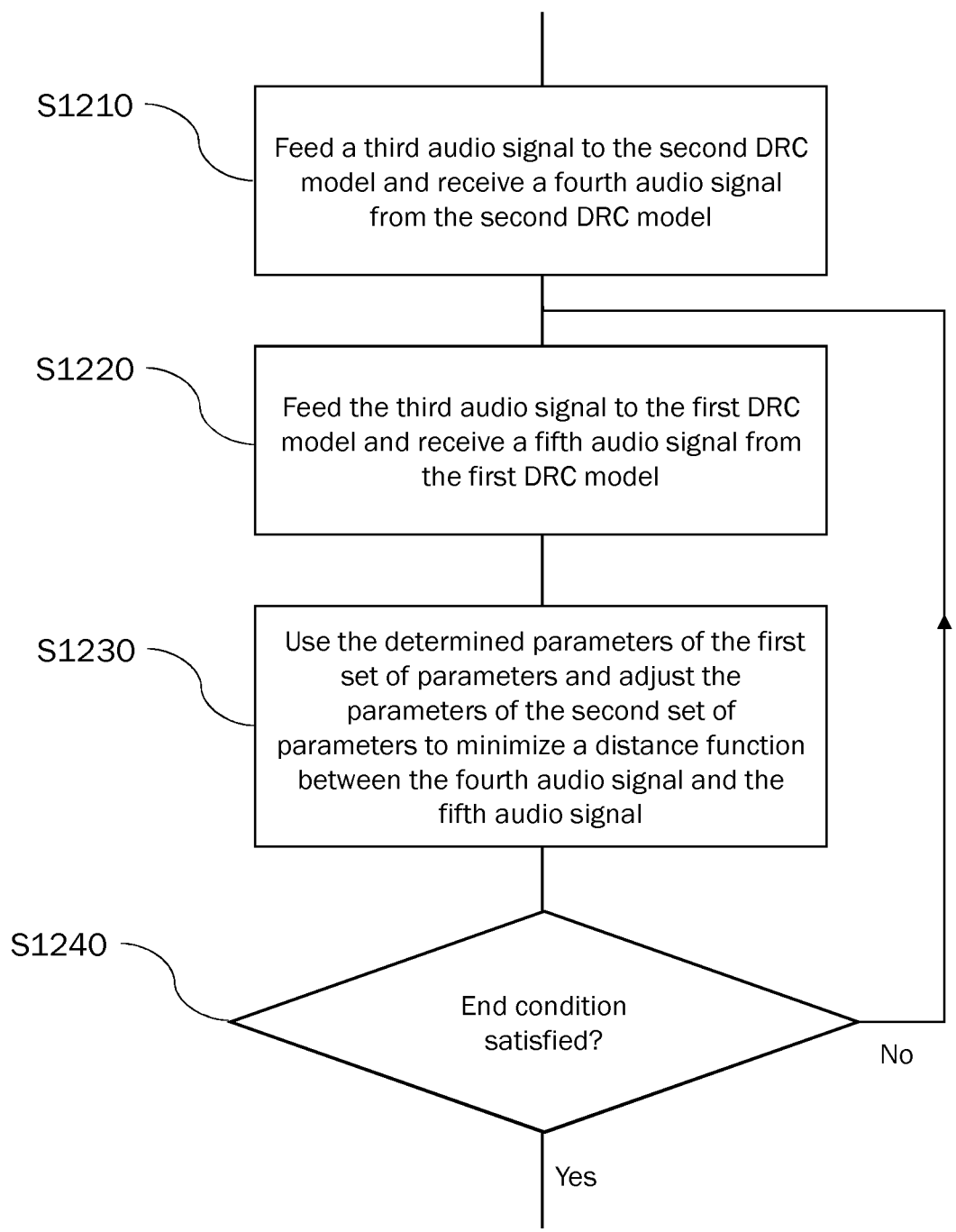
FIG. 12 is a flowchart illustrating details of another example of a method of determining parameters for use by a desired DRC model, according to example embodiments of the present disclosure.
Figure 13:
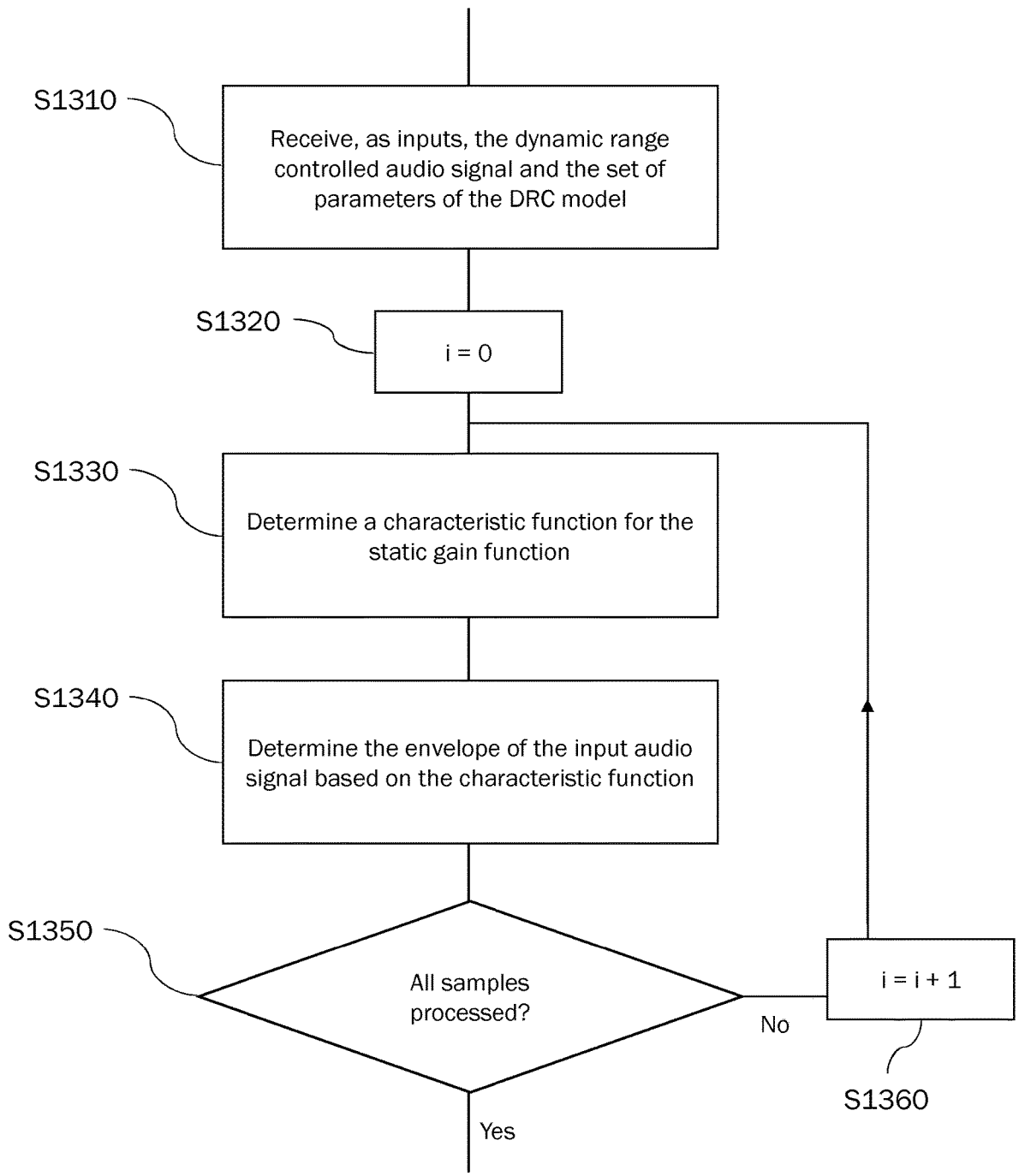
FIG. 13 is a flowchart illustrating an example of a method of reversing DRC of a dynamic range controlled audio signal, according to example embodiments of the present disclosure.

Next, an outline of a method of reversing DRC (e.g., dynamic range compression, limiting, clipping) of a dynamic range controlled audio signal by estimating an input audio signal that would yield the dynamic range controlled audio signal when being fed to a DRC model (e.g., a given, or known DRC model) using a set of parameters (e.g., a given, or known set of parameters) according to example embodiments of the present disclosure will be described with reference to FIG. 13. The DRC model is a soft-knee DRC model or a hard-knee DRC model, as described in the present disclosure, and is defined by a control value (control signal) that is applied (e.g., by addition in the logarithmic domain or by multiplication in the linear domain) to an envelope (e.g., to samples of an envelope) of the input audio signal. The control value (control signal) comprises a static gain function F(n), as described above. The method is preferably (though not necessarily) performed in the logarithmic domain. At step S1310, a dynamic range controlled audio signal and the (known) set of parameters of the DRC model are received as inputs. A method for determining parameters of a DRC model that can be used in the context of this method will be described below with reference to FIG. 10, FIG. 11, and FIG. 12. The proposed method is to be performed for each sample of the dynamic range controlled audio signal. This is indicated by step S1320, at which a sample index i is initialized to zero. However, also other initialization values are feasible, as long as it is ensured that all samples of the dynamic range controlled audio signal are processed. Then, at step S1330, a characteristic function is determined for the static gain function. This characteristic function is a function of the envelope of the input audio signal and depends on one or more of the set of parameters of the DRC model. The envelope of the input audio signal can be determined from the characteristic function by setting the characteristic function to zero and solving for the envelope. At step S1340, the envelope of the input audio signal (for the present sample) is determined based on the characteristic function. This may be achieved for example by setting the characteristic function to zero and solving for the value of the envelope of the input audio signal, as indicated above. At step S1350, it is determined (e.g., checked) whether all samples of the dynamic range compressed audio signal have been compressed. If so (Yes at step S1350), the method ends. Otherwise (No at step S1350), sample index i is incremented by one and the method returns to step S1330.

In one example embodiment, the DRC parameters (e.g., roots of the DRC characteristic function) are separated into two sets of parameters, the so-called "linear"-operation parameters (first set of parameters), which comprise the make-up gain (M), and the threshold, or knee value (T), and the so-called "nonlinear"-operation parameters (second set of parameters) which are compression ratio (R), attack time constant ($\tau_{attack}$), release time constant ($\tau_{release}$) and the knee width (W).

The example embodiment described herein can approximate the uncompressed signal as shown below:

$$\tilde{x}(n) = \text{sgn}(y) \cdot \tilde{r}(n)$$ (Equation No. 13)

Given the compressed signal defined in the problem statement (Equations 1-13), the static gain function F(n) is a piece-wise defined static gain function. Accordingly, the uncompressed signal can be estimated in two pieces: a quadratic piece and a linear piece (above the threshold). Thus, the characteristic function that is determined at step S1330 may correspond to either the quadratic piece or the linear piece.

The compressed signal can be written in the log domain using Equations 7, 8 and 11 as in the following:

$$Y(n) = V(n) + \alpha F(n) + (1-\alpha)G(n-1) + M \quad \text{(Equation No. 14)}$$

The quadratic piece is calculated by substituting Equation 10 in Equation 14 as shown in Equation 15.

$$Y(n) = V(n) - \alpha S \cdot \frac{\left[V(n) - \left(T - \frac{W}{2}\right)\right]^2}{2W} + (1-\alpha)G(n-1) + M = a V^2(n) + b V(n) + K_1 \quad \text{(Equation No. 15)}$$

In Equation 15, a, b, and $K_1$ are defined as in the following:

$$a = -\frac{\alpha S}{2W} \quad \text{(Equation No. 15a)}$$

$$b = 1 + \frac{\alpha S}{W}\left(T - \frac{W}{2}\right) \quad \text{(Equation No. 15b)}$$

$$K_0 = (1-\alpha)G(n-1) + M \quad \text{(Equation No. 15c)}$$

$$K_1 = -\frac{\alpha S}{2W}\left(T - \frac{W}{2}\right)^2 + K_0 \quad \text{(Equation No. 15d)}$$

The characteristic function for the quadratic piece is shown in Equation 16.

$$Z_1(V) = a V^2(n) + b V(n) + c \quad \text{(Equation No. 16)}$$

In Equation 16, c is defined as the following:

$$c = K_1 - Y(n) \quad \text{(Equation No. 16a)}$$

The two roots of Equation 16 are given by:

$$V_{1,0}^{(i)} = \frac{-b \pm \sqrt{b^2 + 4ac}}{2a} \text{ with } i = 1, 2 \quad \text{(Equation No. 17)}$$

The positive root yields the desired result.

The linear piece is calculated by substituting Equation 10 in Equation 14 as shown in Equation 18.

$$Y(n) = V(n) - \alpha S.[V(n) - T] + (1-\alpha)G(n-1) + M = [1-\alpha S].V(n) + K_2 \quad \text{(Equation No. 18)}$$

In Equation 18, $K_2$ is defined as:

$$K_2 = \alpha S T + K_0 \quad \text{(Equation No. 18a)}$$

The characteristic function for the linear piece is shown in Equation 19.

$$Z_2(V) = [1 - \alpha S].V(n) + K_2 - Y(n) \quad \text{(Equation No. 19)}$$

Setting Equation 19 to zero yields the following solution:

$$V_{2,0}(n) = \frac{Y(n) - K_2}{1 - \alpha S} \quad \text{(Equation No. 20)}$$

The relevant one of the characteristic functions $Z_1(V)$ and $Z_2(V)$ is determined based on an estimate of the envelope of the input signal for the present sample. To this end, the method of FIG. 13 may further comprise, for each sample, estimating an envelope of the input audio signal (e.g., in the logarithmic domain). Then, the relevant (or applicable) piece of the piece-wise defined static gain function F(n) can be determined based on the estimated envelope. This is that piece of the static gain function F(n) (e.g., the quadratic piece or the linear piece) that relates to the estimated envelope, i.e., that piece of the static gain function in which the estimated envelope lies. Put differently, the relevant one of the characteristic functions can be determined based on the estimated envelope, the relevant characteristic function being that characteristic function that relates to the relevant piece of the static gain function. For example, for the estimated envelope $\hat{V}$ satisfying $$\hat{V}(n) \geq T + \frac{W}{2},$$

the (linear) characteristic function $Z_2(V)$ is determined to be the relevant one. On the other hand, for the estimated envelope $\hat{V}$ satisfying $$T - \frac{W}{2} < \hat{V}(n) < T + \frac{W}{2},$$

the (quadratic) characteristic function $Z_1(V)$ is determined to be the relevant one.

Examples of methods for estimating the envelope of the input audio signal are described below. For example, the envelope may be estimated based on the value of the present sample of the dynamic range controlled audio signal, a value of the smoothed gain function for the preceding sample, and one or more of the set of parameters of the DRC model. Alternatively, the envelope may be estimated by linear prediction from the determined envelopes for the two (or more) preceding samples of the dynamic range controlled signal, for example, in the logarithmic domain.

The above characteristic functions depend on the smoothing factor α, which is generally chosen based on Equation 12. For example, for the processor to be in attack, F(n)<G(n−1) must be satisfied. However, since V(n) and therefore the choice of F(n) in Equation 10 are unknown, a new condition that relies only on known values is required. In general, the value of the smoothing factor (e.g., either attack or release) can be determined based on the value of the present sample of the dynamic range compressed audio signal, the smoothed gain function for the preceding sample, and one or more of the set of parameters of the DRC mode.

For example, Equation 14 can be rewritten as follows:

$$Y(n) = V(n) + M + \left[1 - \alpha\left(1 - \frac{F(n)}{G(n-1)}\right)\right]G(n-1) \quad \text{(Equation No. 21)}$$

If the compressor is in the attack mode, that is F(n)<G(n−1), $$Y(n) < V(n) + G(n-1) + M \quad \text{(Equation No. 22)}$$

Correspondingly, $$V(n) > Y(n) - G(n-1) - M \quad \text{(Equation No. 23)}$$

during attack.

In this case, the solution for the quadratic piece can be found by plugging Equations 8 and Equation 23 in F(n)<G(n−1) as shown in Equation 24, $$-S \cdot \frac{\left[Y(n) - G(n-1) - M - \left(T - \frac{W}{2}\right)\right]^2}{2W} < G(n-1) \quad \text{(Equation No. 24)}$$

All variables in Equation 24 are now known.

The linear piece can be found by plugging Equations 8 and 23 in F(n)<G(n−1) as shown in Equation 25.

$$-S \cdot [Y(n) - G(n-1) - M - T] < G(n-1) \quad \text{(Equation No. 25)}$$

The compressor is said to be in the attack mode if either condition in Equations 24 or Equation 25 are met. Thus, for the estimated envelope lying in the quadratic piece of the static gain function $$\left(\text{i.e., for } T - \frac{W}{2} < \hat{V}(n) < T + \frac{W}{2}\right),$$

the smoothing factor is determined to have a value relating to the attack time constant if Equation 24 is satisfied, and to have a value relating to the release time constant otherwise. Further, for the estimated envelope lying in the linear piece of the static gain function $$\left(\text{i.e., for } \hat{V} \geq T + \frac{W}{2}\right),$$

the smoothing factor is determined to have a value relating to the attack time constant if Equation 25 is satisfied, and to have a value relating to the release time constant otherwise.

Several approaches for estimating the envelope V of the input audio signal are feasible. To obtain an estimate for the envelope V between release and attack, one can refer to Equation 23 which already provides such estimate. Accordingly, an estimate of the envelope is given by $$\hat{V}(n) = Y(n) - G(n-1) - M \quad \text{(Equation No. 26)}$$

To estimate the envelope V between feed-through and compression, the crossing point (e.g., in terms of signal level, the operational crossing point corresponds to the threshold level. The two terms, however, are not interchangeable.) between feed-through (e.g., the operation mode in which the input signal is "fed through" uncompressed through the static nonlinearity, i.e. when the level of the input signal is below the threshold level) and compression (e.g., when the input level is above the threshold, and so the output is a compressed version of the input) is estimated. To this end, F is assumed to be zero, F=0. By combining Equation 15 and Equation 15c the following equation is found:

$$Y(n) = V(n) + K_0 \quad \text{(Equation No. 27a)}$$

Correspondingly, the estimate for V is:

$$\hat{V}(n) = Y(n) - K_0 \quad \text{(Equation No. 27b)}$$

An alternative method for estimating V is obtained through linear extrapolation in the linear domain, which is equivalent to linear prediction of order one with all its coefficients set to 1, that is:

$$\tilde{x}(n) = 2\tilde{x}(n-1) - \tilde{x}(n-2) \quad \text{(Equation No. 28a)}$$

$$\tilde{v}(n) = |\tilde{x}(n)| \quad \text{(Equation No. 28b)}$$

$$\hat{V}(n) = 20 \log_{10} \tilde{v}(n) \quad \text{(Equation No. 28c)}$$

If the value of V is estimated using Equations 28, then F(n) can be computed directly by using Equation 7 and then simply replacing V(n) with $\hat{V}(n)$.

The advantage of this estimation method is that it does not make any assumption with respect to α. It only requires the storage of the two past values of $\tilde{x}$. The disadvantage is that this method is usually less accurate.

The smoothed gain, G(n), is updated at each time instant n, as shown in Equation 29:

$$G(n) = \quad \text{(Equation No. 29)}$$

$$\begin{cases} Y(n) - \tilde{V}(n) - M & \text{if } T + \frac{W}{2} > V(n) > T - \frac{W}{2} \\ (1-\alpha)G(n-1) & \text{otherwise} \end{cases}$$

It should be appreciated that the DRC inversion technique described herein assumes a predetermined DRC model and parameters.

Set forth below is a snippet of pseudo code ("compressor") suitable for carrying out one or more embodiments disclosed herein.

```
Function COMPRESS(x, θ)
    G_n ← 0
    for n ← 1, N do
        V_n ← 20 log₁₀|x_n| if V_n ≤ T - w/2 then

F_n ← 0 else if V_n ≥ T + W/2 then

F_n ← -S ·(V_n - T)
        else

F_n ← -S · [V_n - (T - w/2)]² / 2W end if
        if F(n) < G_n then
            α ← α_attack
        else
            α ← α_release
        end if
        G_n ← α F_n + (1 - α)G_n g_n ← 10^(G_n + M/2)

y_n ← g_n · x_n
    end for
    return y
end function
```

Set forth below is a snippet of pseudo code ("decompressor") suitable for carrying out one or more embodiments disclosed herein.

```
Function DECOMPRESS(y, θ)
    G_n ← 0
    for n ← 1, N do
```

-continued $$Y_n \leftarrow 20 \log_{10}|y_n|$$
$$\hat{V}_n \leftarrow Y_n - G_n - M$$

if $\hat{V}_n \leq T - \frac{W}{2}$ then $$F_n \leftarrow 0$$

else if $\hat{V}_n \geq T + \frac{W}{2}$ then $$F_n \leftarrow -S \cdot (\hat{V}_n - T)$$
else $$F_n \leftarrow -S \cdot \left[\hat{V}_n - \left(T - \frac{W}{2}\right)\right]^2 / 2W$$

end if
if $F(n) < G_n$ then
  $\alpha \leftarrow \alpha_{attack}$
else
  $\alpha \leftarrow \alpha_{release}$
end if
$K_0 \leftarrow (1 - \alpha)G_n + M$ if $\hat{V}_n \leq T - \frac{W}{2}$ then $G_n \leftarrow (1 - \alpha)G_n$
  $\tilde{V}_n \leftarrow Y_n - G_n - M$ else if $\hat{V}_n \geq T + \frac{W}{2}$ then $$\tilde{V}_n \leftarrow \frac{Y_n - \alpha ST - K_0}{1 - \alpha S}$$

$G_n \leftarrow Y_n - \tilde{V}_n - M$
else $$a \leftarrow \frac{-\alpha S}{2W}$$

$$b \leftarrow 1 - 2a\left(T - \frac{W}{2}\right)$$

$c \leftarrow a(T - W/2)^2 + K_0 - Y_n$
  $D \leftarrow b^2 - 4ac$ $$\tilde{V}_n \leftarrow \frac{\sqrt{D} - b}{2a}$$

$G_n \leftarrow Y_n - \tilde{V}_n - M$
end if
$\tilde{v}_n \leftarrow 10^{\tilde{V}_n/20}$
$z_n \leftarrow \text{sgn}(y_n) \cdot \tilde{v}_n$
end for
return z
end function

4. Parameter Identification for a Known DRC Model

Next, techniques for determining (e.g., estimating) parameters (e.g., a set of parameters) for use by a first DRC model (e.g., applied by a DRC processor or DRC system) according to example embodiments of the present disclosure will be described.

Here and in the other parts of the present disclosure, a DRC model that is known, but whose parameters are unknown, shall be understood to be a DRC model for which the applicable set of parameters as such is known (e.g., which parameters are present in the DRC model), and the DRC model's (functional) dependence on the set of parameters as such is known (e.g., how these parameters impact DRC by the DRC model), but the actual values of the parameters are unknown. Moreover, here and in the other parts of this disclosure, "estimating parameters", "determining parameters", etc., shall be understood to relate to estimating, determining, etc., (actual) values of the parameters.

If a second DRC model (predetermined DRC model) that is to be reproduced is known, but its parameters are unknown, then the parameters can be estimated using a rule-based (e.g., heuristic) technique in accordance with the example embodiment of the present disclosure. Thereby, when using the determined parameters, the first (known) DRC model can be made to reproduce the second DRC model. Further, example embodiments of the present disclosure can be employed to determine parameters for the first DRC model so that the first DRC model, using these parameters, reproduces (or at least approximates) an unknown second DRC model. For simplicity, in this section a hard knee DRC model with no look-ahead or clipping may be considered.

The identification of unknown DRC parameters for the model introduced in the problem statement can be achieved through a rule-based (e.g., heuristic) technique discussed below.

Figure 10:
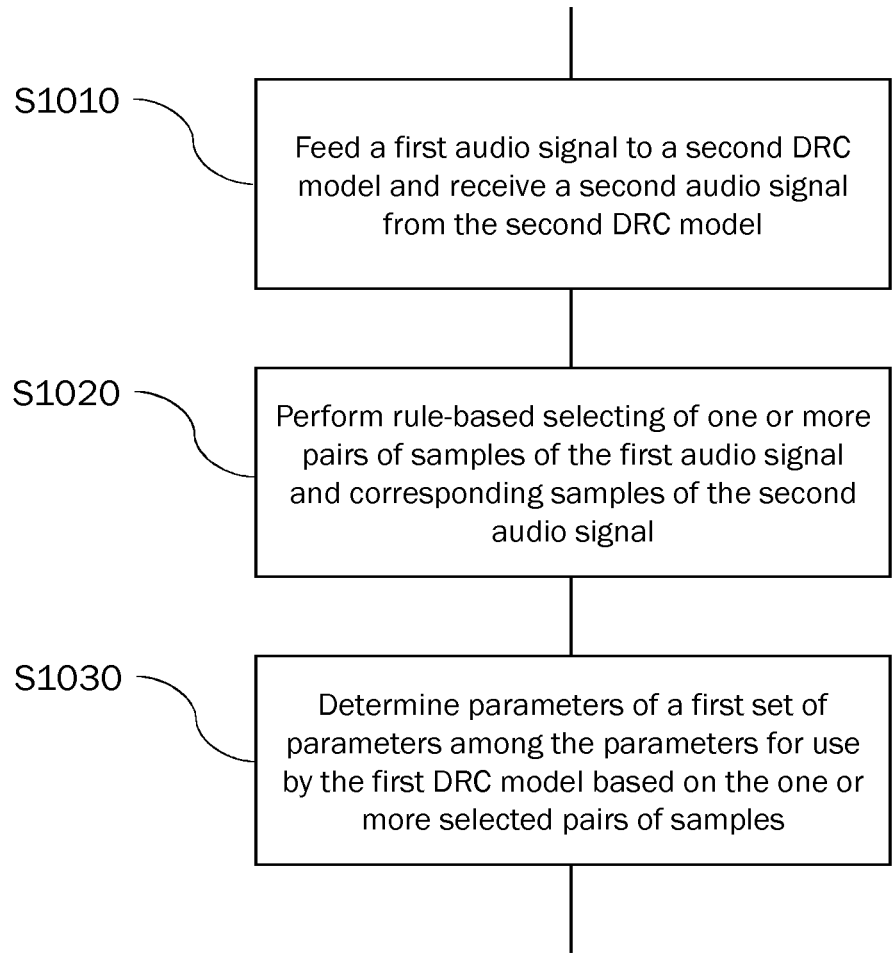
FIG. 10 is a flowchart illustrating an example of a method of determining parameters for use by a desired DRC model, according to example embodiments of the present disclosure.

An outline of an example method of determining parameters for use by the first DRC model is schematically illustrated in the flow chart of FIG. 10. At step S1010, a first audio signal (an input audio signal) is fed to the second DRC model (that may or may not be identical to the known first DRC model). An output of the second DRC model is received as a second audio signal. Accordingly, the second audio signal may be a dynamic range controlled (e.g., compressed, limited, or clipped) version of the first audio signal. At step S1020, rule-based (e.g., heuristic) selecting of one or more pairs of samples of the first audio signal and corresponding samples of the second audio signal is performed. That is, each pair comprises a sample of the first audio signal and a corresponding sample of the second audio signal. These samples may be samples in the logarithmic domain, for example, samples V(n) (or X(n)) and Y(n) as defined above. Then, at step S1030, parameters of a first set of parameters for use by the first DRC model are determined based on the one or more pairs of samples selected at step S1020. The first set of parameters may be the linear operation parameters of the first DRC model. For example, the first set of parameters may comprise any or both of the make-up gain and the threshold value (knee value) defined above. As indicated above, the method in suit is preferably performed in the logarithmic domain. Thus, the method may further comprise converting the first audio signal (and, if necessary, also the second audio signal) to the logarithmic domain.

Next, examples for determining specific parameters of a soft-knee or hard-knee DRC model as the first DRC model will be described.

Make-Up Gain

The following difference function shown in Equation 30 can be derived using Equation 7 and Equation 8 to estimate the make-up gain.

$$Z(n)=Y(n)-V(n)=G(n)+M \qquad \text{(Equation No. 30)}$$

Z(n) is a new variable defined as the difference between the compressed signal (second audio signal) and envelope signal (first audio signal) in the logarithmic domain. For downward-compression, Z(n) is bounded from above by the make-up gain (constant gain portion) M. Therefore, to estimate the make-up gain, at least one sample of G(n) must be equal to zero, i.e., there must be one pair of samples for which G(n) is equal to zero. Typically, such a pair of samples can be found. The make-up gain M is then the maximum of the set $\{Z(n)\}_n$ as shown in Equation 31.

$$\exists n \in \mathbb{N} : G(n)=0 \rightarrow M = \max\{Z(n)\}_n \quad \text{(Equation No. 31)}$$

For upward-compression (expansion), Z(n) is bounded from below by the make-up gain (constant gain portion). In this case, the make-up gain is the minimum of the set $\{Z(n)\}_n$.

Put differently, the rule-based selecting of the one or more pairs of samples may involve selecting a (first) pair of samples that has an extremal (e.g., maximum, for downward-compression, or minimum, for upwards-compression) value of a difference (in the logarithmic domain, or ratio in the linear domain) between the value of the sample of the second audio signal in the pair and the value of the sample of the first audio signal in the pair. The rule for selecting the first pair of samples is to select that pair of samples with the extremal value of the difference between the value of the sample of the second audio signal in the pair and the value of the sample of the first audio signal in the pair. The make-up gain (constant gain portion) is then determined based on said extremal value. For instance, as indicated above, the make-up gain (constant gain portion) may be determined to be equal to said extremal value.

Once the make-up gain M is known, the smooth gain function G(n) can be calculated using Equation 32.

$$G(n)=Z(n)-M \quad \text{(Equation No. 32)}$$

Threshold (Knee Value)

The threshold, T, is the transition point at which DRC sets in. Below the threshold, the input signal is fed through, i.e., unit gain is applied. If the set $\{Z(n)\}_n$ contains at least one sample with its value being equal to the threshold, T, the threshold is then the maximum value of V(n) for which G(n) is zero as shown in Equation 33a.

$$\exists n \in \mathbb{N} : Z(n)=T \rightarrow T = \max\{V(n):G(n)=0\}_n \quad \text{(Equation No. 33a)}$$

Put differently, the rule-based selecting of the one or more pairs of samples may involve selecting a (fourth) pair of samples, which is that pair of samples that has the maximum value of the sample of the first audio signal for which the variable gain portion G(n) (as determined for example, by Equation No. 32) is (still) zero. That is, the fourth pair of samples is selected among all those pairs of samples for which the variable gain portion G(n) is zero, as that pair that has the largest sample of the first audio signal. This is the pair of samples that is closest to, but still below, the point at which DRC sets in. The rule for selecting the fourth pair of samples is to select that pair of samples that has the maximum value of the sample of the first audio signal for which the variable gain portion G(n) is (still) zero. For this fourth pair of samples, the difference between the value of the sample of the first audio signal and the value of the sample of the second audio signal is substantially given by the constant gain portion. The threshold (knee value) may then be determined based on the value of the sample of the first audio signal (or the envelope thereof) in the fourth pair, for example, to be equal to said value. An alternative approach towards determining the threshold will be described below.

Threshold, Knee Type and Knee Width

The necessary and sufficient condition for the estimation of knee-related parameters, for example, threshold and knee width with high confidence is that the DRC processor/model is operated as a limiter-type DRC. More specifically, the reference model must have been parameterized with a short attack and release time constants (e.g., short with respect to durations of respective portions of the input signal). In such a scenario, the smoothed or dynamic gain function G(n) can asymptotically be approximated by the static gain function F(n), alias the DRC curve. It further assumes that there exist sufficient amounts of envelope values around the nominal threshold level.

The type of the knee, for example, soft knee or hard knee, can be determined as follows:

i. Numerically compute the left-sided limit of the slope of F(n) for smallest envelope value in the considered interval, which is either zero, a small value, or possibly a negative number. To this end, said rule-based selecting may involve selecting a (second) pair of samples for which the value of the sample of the first audio signal in the pair has a value below a first threshold. For example, the value of the sample of the first audio signal in the second pair of samples may have a minimum value among the samples of the first audio signal (e.g., among the set $\{V(n)\}_n$ or $\{X(n)\}_n$). Said determining at step S1030 may then comprise calculating a (first) slope of the aforementioned first linear portion of the static gain function, based on the second pair of samples. For example, said determining may involve determining a parameterization of the first linear portion based on the second pair of samples.

ii. Numerically compute the right-sided limit of the slope of F(n) for the largest envelope value in the considered interval, which should be equal to the negative slope S of the linear piece of F(n). The largest envelope value is typically 0 dBFS. To this end, said rule-based selecting may involve selecting a (third) pair of samples for which the value of the sample of the first audio signal in the pair has a value above a second threshold. For example, the value of the sample of the first audio signal in the third pair of samples may have a maximum value among the samples of the first audio signal (e.g., among the set $\{V(n)\}_n$ or $\{X(n)\}_n$). Said determining at step S1030 may then comprise calculating a (second) slope of the aforementioned second linear portion of the static gain function, based on the third pair of samples. For example, said determining may involve determining a parameterization of the second linear portion based on the third pair of samples.

iii. Determine the threshold (knee value) based on the first slope and the second slope. This may involve numerically extrapolating two lines from the left- and right-sided bounds of the considered interval with the slopes computed above. The intersection of the two lines marks the threshold level T. Put differently, the threshold (knee value) may be determined based on the parameterization of the first linear portion and the parameterization of the second linear portion, for example, by determining an intersection point between the first linear portion and the second linear portion. This may be achieved by numerical extrapolation, as indicated above.

If the measured value of the smooth gain G(n) for the threshold value T is in the neighborhood of the point of intersection (e.g., within a predefined value), it can be assumed that the knee type is a hard knee, which correspondingly means that the knee width is zero. Otherwise the knee type is assumed to be a soft knee.

Summarizing, the rule-based selecting at step S1020 of FIG. 10 may include any one or any combination of: selecting (e.g., in the logarithmic domain) a pair of samples that has an extremal (e.g., maximum or minimum) value of a difference between a value of the sample of the second audio signal in the pair and a value of the sample of the first audio signal in the pair, selecting (e.g., in the logarithmic domain) a pair of samples for which the value of the sample of the first audio signal in the pair has a value below a first threshold (e.g., has a minimum value among the samples of the first audio signal), selecting (e.g., in the logarithmic domain) a pair of samples for which the value of the sample of the first audio signal in the pair has a value above a second threshold (e.g., has a maximum value among the samples of the first audio signal), and selecting (e.g., in the logarithmic domain) a pair of samples, which is that pair of samples that has the maximum value of the sample of the first audio signal for which the variable gain portion is zero.

Figure 11:
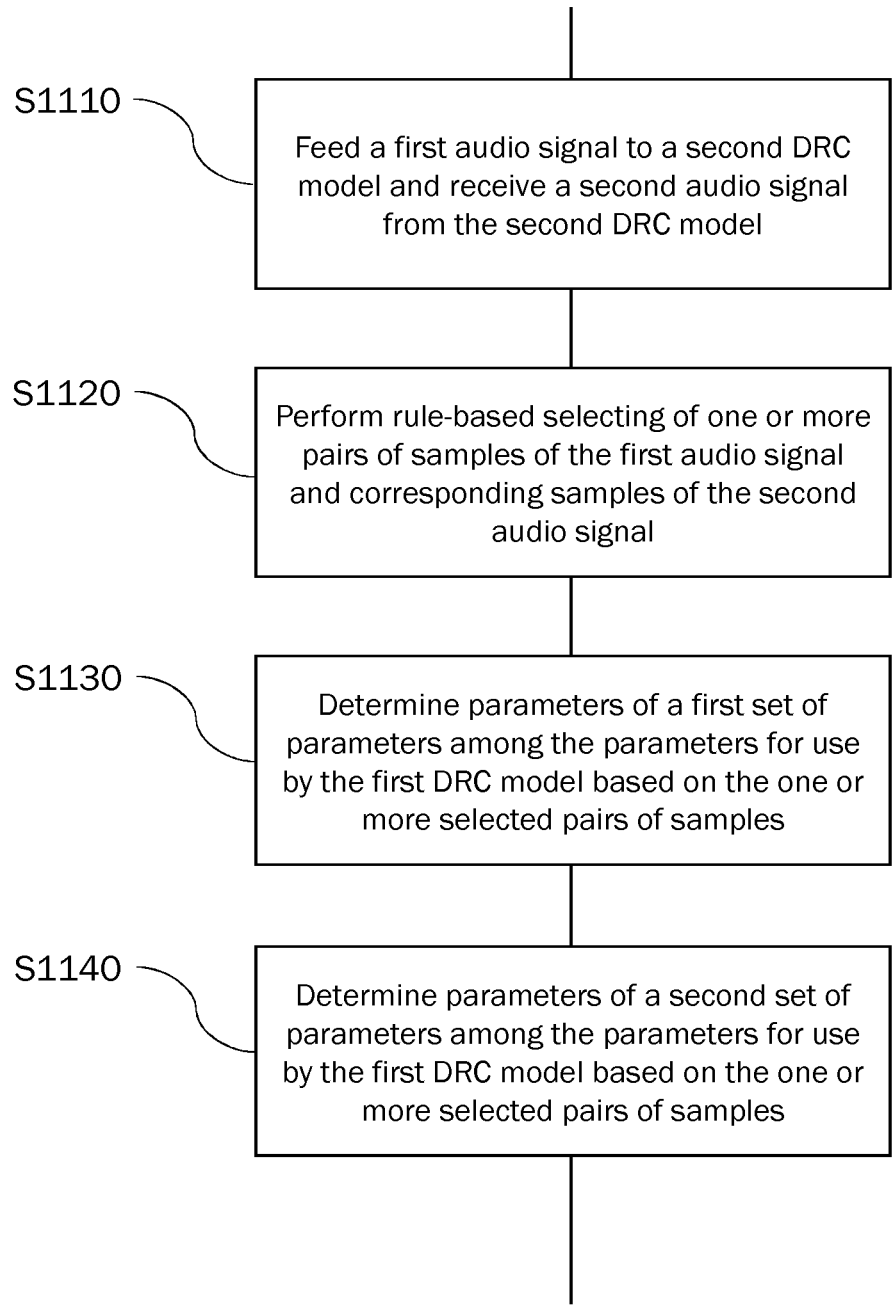
FIG. 11 is a flowchart illustrating another example of a method of determining parameters for use by a desired DRC model, according to example embodiments of the present disclosure.

An outline of another method of determining parameters for use by the first DRC model is schematically illustrated in the flow chart of FIG. 11. Steps S1110, S1120, and S1130 may correspond to steps S1010, S1020, and S1030, respectively, in FIG. 10 and described above. Then, at step S1140, parameters of a second set of parameters for use by the first DRC model are determined based on the one or more pairs of samples selected at step S1120. The second set of parameters may be the remaining ones among the parameters for use by the first DRC model that are not contained in the first set of parameters. For example, the second set of parameters may comprise (e.g., consist of) the non-linear operation parameters of the first DRC model. For example, the second set of parameters may comprise any or any combination of the knee width, the compression ratio, the attack time constant, and the release time constant. As indicated above, the method in suit is preferably performed in the logarithmic domain. Thus, the method may further comprise converting the first audio signal (and, if necessary, also the second audio signal) to the logarithmic domain.

In the case of a soft knee, the threshold T is the same as in the case of the hard knee as before. The knee width may be determined based on the aforementioned fourth pair of samples. That is, the rule-based selecting at step S1120 may (further) involve selecting the fourth pair of samples. The determining at step S1140 may (further) involve determining the knee width based on the fourth pair of samples, or, more specifically, based on the value (e.g., V(n) or X(n)) of the sample of the first audio signal in the fourth pair of samples. The left endpoint of the knee is the transition point at which DRC sets in. So, if the set $\{U(n)\}_n$ contains at least one sample with its value being equal to T-W/2, the transition point can be found as the maximum value of V for which G is zero as depicted in Equation 33b. This V is in the fourth pair of samples. The knee width follows directly from Equation 33b as shown in Equation 33c.

$$\exists n \in \mathbb{N}_0 : V(n) = \qquad \text{(Equation No. 33b)}$$
$$T - \frac{w}{2} \rightarrow T - w/2 = \max\{V(n) : G(n) = 0\}_n$$

$$W = 2(T - \max\{V(n) : G(n) = 0\}) \qquad \text{(Equation No. 33c)}$$

That is, the knee width depends on (e.g., is determined based on) the threshold and the value (e.g., V(n) or X(n)) of the sample of the first audio signal in the fourth pair of samples. As indicated above, the knee width may turn out to be zero. In this case, the value of the sample of the first audio signal in the fourth pair of samples is (substantially) equal to the threshold (knee value).

Compression Ratio

The compression ratio applies when the envelope V(n) exceeds the threshold T (or, for a soft-knee model the level T-W/2). In order to determine the compression ratio R, the rule-based selecting at step S1120 may involve selecting a (fifth) pair of samples for which the value of the sample of the first audio signal is larger than the knee value and for which the value of the smoothed gain function is substantially equal to the value of the smoothed gain function for the preceding sample of the first audio signal. The fifth pair of samples may be further selected such that a value of the sample of the first audio signal (or the envelope thereof) in the pair is above the threshold (knee value; for a hard-knee model), or above the threshold minus half the knee width (for a soft-knee model). The determining at step S1130 may then further involve determining the aforementioned second slope based on the value of the sample of the first audio signal in the fifth pair of samples and the value of the smoothed gain function for the sample of the first audio signal in the fifth pair of samples. The second slope may be determined further based on the threshold T and, if applicable, the knee width W. The compression ratio R may then be determined based on the second slope, for example, using Equation 9.

Namely, if there exists at least one sample for which the current smooth gain G(n) is equal to its previous value G(n-1), then Equation 10 can be rewritten as:

$$G(n) = F(n) \qquad \text{(Equation No. 34)}$$

Consider the following set:

$$M_R = \{n \in \mathbb{N} : V(n) > T - W/2 \hat{} G(n) = G(n-1)\} \qquad \text{(Equation No. 35)}$$

The slope can then be derived as:

$$S = \begin{cases} S_1 & \text{if } T - W/2 < V(n) < T + W/2 \\ S_2 & \text{if } V(n) \geq T + W/2 \end{cases} \qquad \text{(Equation No. 36)}$$

with $$S_1 = -\frac{2W \cdot G(m)}{\left[V(m) - \left(T - \frac{W}{2}\right)\right]^2}, m \in M_R \qquad \text{(Equation No. 36a)}$$

$$S_2 = -\frac{G(m)}{V(m) - T}, m \in M_R \qquad \text{(Equation No. 36b)}$$

where W>0.

The compression ratio R can then be determined using Equation 9.

Attack Time Constant

The attack is characterized by an event when the envelope crosses the threshold or when F(n) becomes smaller than G(n-1). When the envelope crosses the threshold, the previous gain value G(n-1) must be zero. If F(n)<G(n-1), it then follows that G(n)≤G(n-1). It should be noted that V(n) is certainly greater than or equal to the threshold T. In order to determine the attack smoothing factor (which is related to the attack time constant), as a first smoothing factor, the rule-based selecting at step S1120 may involve selecting a (sixth) pair of samples for which the value of the smoothed gain function for the preceding sample of the first audio signal is substantially zero and for which the value of the smoothed gain function is smaller than the value of the smoothed gain function for the preceding sample of the first audio signal. Then, the determining at step S1130 may involve determining the first smoothing factor (the attack smoothing factor) based on the value of the static gain function F(m) for the sample of the first audio signal in the sixth pair of samples and the value of the smoothed gain function G(m) for the sample of the first audio signal in the sixth pair of samples.

Namely, consider the following definition:

$$M_{attack}^o = \{n \in \mathbb{N} : G(n-1) = 0 \char`\^ G(n) < G(n-1)\} \quad \text{(Equation No. 38)}$$

Notably, the sixth pair of samples has its sample of the first audio signal in the set $M_{attack}^o$.

For samples in $M_{attack}^o$, Equation 10 can then be rewritten as shown in Equation 39:

$$G(m) = \alpha_{attack} F(m), m \in M_{attack}^o \quad \text{(Equation No. 39)}$$

Then, the first smoothing factor can be determined via $$\alpha_{attack} = \frac{G(m)}{F(m)}, m \in M_{attack}^0 \quad \text{(Equation No. 39a)}$$

The static nonlinearity (static gain function) F(n) in this scenario is assumed to be the following:

$$F(n) = \begin{cases} \tilde{F}(n) & \text{if } V(n) \geq T \\ 0 & \text{otherwise} \end{cases} \quad \text{(Equation No. 40)}$$

In Equation 40, $\tilde{F}(n)$ is defined as:

$$\tilde{F}(n) = -S \cdot [V(n) - T] \quad \text{(Equation No. 41)}$$

Using Equation 39 and Equation 41, the attack smoothing factor can be alternatively computed as:

$$\alpha_{attack} = -\frac{G(m)}{S \cdot [V(m) - T]}, m \in M_{attack}^0 \quad \text{(Equation No. 42)}$$

That is, the determining at step S1130 may alternatively involve determining the first smoothing factor (the attack smoothing factor) based on the value of the smoothed gain function G(m) for the sample of the first audio signal in the sixth pair of samples and the value of the sample (e.g., V(m) or X(m)) of the first audio signal in the sixth pair of samples. The first smoothing factor may be determined further based on the determined second slope and the threshold.

The smoothing factor α can then be converted to the time domain τ (i.e., to its corresponding time constant), for example, by using Equation 11 as shown in Equation 43.

$$\tau = -\frac{1}{f_s \log(1 - \alpha)} \quad \text{(Equation No. 43)}$$

A more generic approach is to use the following set instead of $M_{attack}^o$:

$$M_{attack} = \{n \in \mathbb{N} : F(n) < G(n-1)\} \supseteq M_{attack}^o \quad \text{(Equation No. 44)}$$

That is, the sixth pair of samples may be further selected such that the static gain function for the sample of the first audio signal in the sixth pair of samples is smaller than the smoothed gain function for the preceding sample.

The smoothing gain factor can then be calculated as:

$$\alpha_{attack} = \frac{G(m) - G(m-1)}{F(m) - G(m-1)}, m \in M_{attack} \quad \text{(Equation No. 45)}$$

That is, the determining at step S1130 may alternatively involve determining the first smoothing factor (the attack smoothing factor) based on the value of the static gain function F(m) for the sample of the first audio signal in the sixth pair of samples, the value of the smoothed gain function G(m) for the sample of the first audio signal in the sixth pair of samples, and the value of the smoothed gain function G(m−1) for the preceding sample of the first audio signal.

Release Time Constant

Determination of the release smoothing factor (which is related to the release time constant) as a second smoothing factor may follow the same rationale as the above determination of the first smoothing factor. For determining the second smoothing factor, the rule-based selecting at step S1120 may involve selecting a (seventh) pair of samples for which the value of the envelope of the first audio signal is larger than or equal to the knee value and the static gain function for the sample of the first audio signal is larger than or equal to the value of the smoothed gain function for the preceding sample of the first audio signal. Then, the determining at step S1130 may involve determining the second smoothing factor (the release smoothing factor) based on the value of the static gain function F(m) for the sample of the first audio signal in the seventh pair of samples, the value of the smoothed gain function G(m) for the sample of the first audio signal in the seventh pair of samples, and the value of the smoothed gain function G(m−1) for the preceding sample of the first audio signal.

Namely, consider the following set:

$$M_{release} = \{n \in \mathbb{N} : V(n) \geq T \char`\^ F(n) \geq G(n-1)\} \quad \text{(Equation No. 46)}$$

F(n) is computed from V(n), T, and S according to the Equation 41. The release smoothing factor can then be computed as:

$$\alpha_{release} = \frac{G(m) - G(m-1)}{F(m) - G(m-1)}, m \in M_{release} \quad \text{(Equation No. 47)}$$

The corresponding release time constant, $\tau_{release}$, can be calculated using Equations 10 and 43, for example.

5. Parameter Identification for an Unknown DRC Model

If the DRC model and its parameters are both unknown (or if the DRC model differs from the predetermined DRC model), then the parameters of a predetermined DRC model can be estimated with the aid of a pilot signal and an arbitrary audio, speech, or music recording in accordance with the example embodiment disclosed herein.

Figure 3:
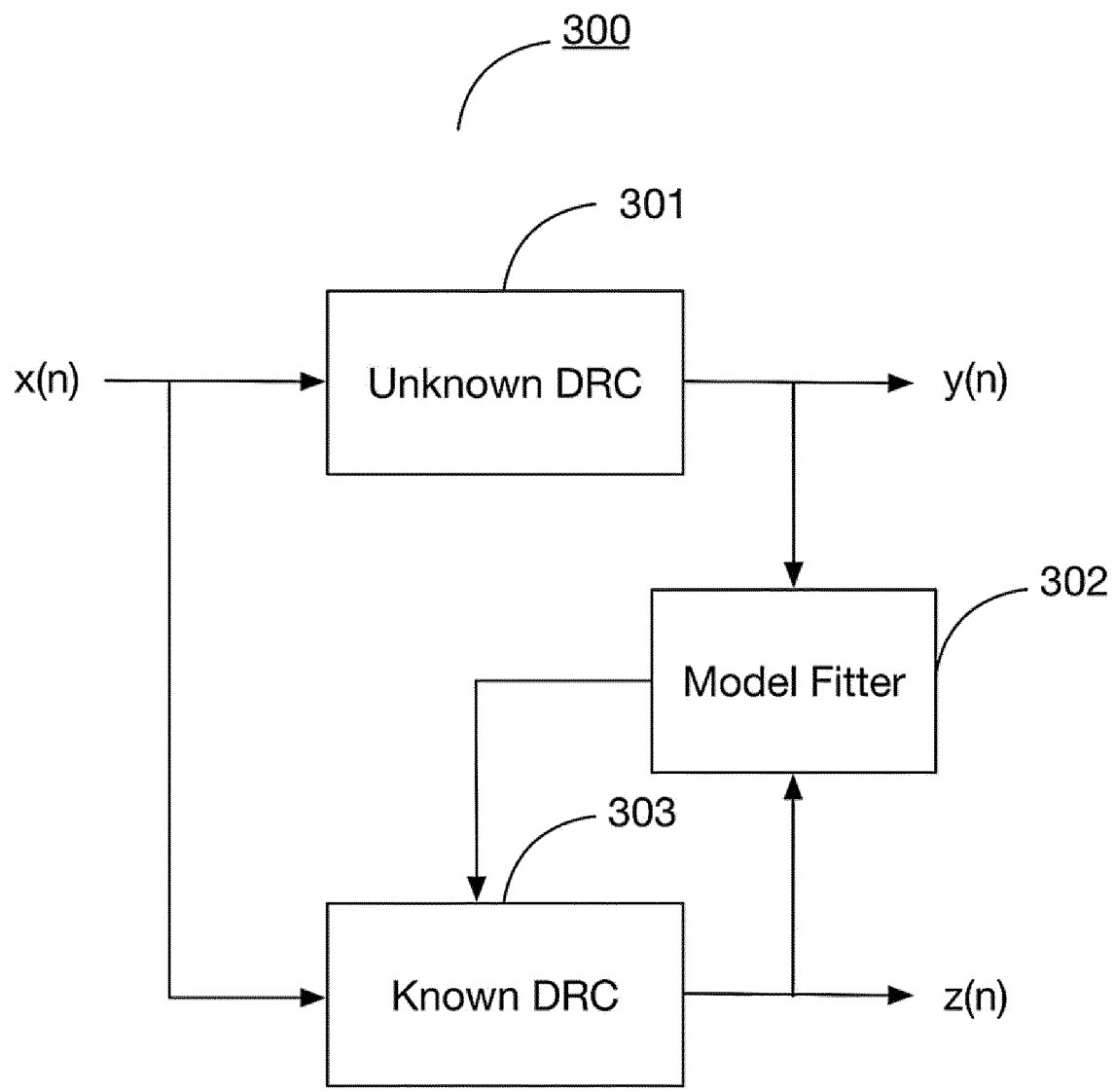
FIG. 3 illustrates a schematic diagram of system identification for an unknown dynamic range controller using an arbitrary signal in accordance with example embodiments of the present disclosure.

Referring to FIG. 3, a system for heuristic parameter identification for an unknown (second) dynamic range compression (DRC) model using an arbitrary signal is shown (300. As can be seen in FIG. 3, an input signal x(n) is fed into system 300 which can be either an audio, speech, or music signal. One example of the objective of the discovery process shown in FIG. 3 is to determine an unknown DRC system 301. In another word, to reproduce the behavior of an unknown DRC model with a different available model. y(n) is the compressed signal resulting of the system 300. Operating parallel to the unknown DRC system, 301 is a known (first) DRC system 303. That is, in the known DRC system 303, the DRC model is known and in the unknown system 301 the DRC model is unknown. A model fitter 302 is disposed between the compressed signal y(n) at the output of the unknown DRC system 301 and the compressed signal z(n) at the output of the known DRC system 303. The model fitter 302 measures the distance, i.e. the difference, between y(n) and z(n). The distance function in 302 could be any meaningful distance function that is convex, but not necessarily analytic. Such distance functions include, for example, the Euclidean, the Taxicab, and the Chebyshev distances as shown in Equation 48.

$$D_L(y,z|P)=\|z(n|P)-y(n)\|_L \quad \text{(Equation No. 48)}$$

In Equation 48, L denotes the desired distance computed as a vector norm. If L is set to 2, the distance function would typically be the Euclidean distance and if L is set to 1 the distance function would be the Taxicab distance, respectively. z(n) is the result of x(n) being compressed by the known DRC model 303. As discussed later in detail, the model fitter 302 estimates the DRC parameters of the known DRC model 303 for nonlinear operation by minimizing the distance from Equation 48 as shown in Equation 49a.

$$P_{opt} = \underset{P}{\operatorname{argmin}}\ D_L(y, z | P) \quad \text{(Equation No. 49a)}$$

$$D_1(y, z) = \sum_n |z(n) - y(n)| \quad \text{(Equation No. 49b)}$$

$$D_2(y, z) = \sqrt{\sum_n [y(n) - z(n)]^2} \quad \text{(Equation No. 49c)}$$

That is, the method of determining the parameters for use by the first (known) DRC model may involve, in addition to the rule-based selecting and the determining of the first set of parameters described above, a step of determining (e.g., estimating) the second set of parameters by minimizing a distance function between a dynamic range controlled audio signal output by the first DRC model and a reference audio signal. The reference audio signal may be an output of the second (unknown) DRC model. As described above, the second set of parameters may comprise the remaining ones of the parameters for use by the first DRC model that are not contained in the first set of parameters. The second set of parameters may comprise the non-linear operation parameters of the first DRC model. Details of this method will be described below with reference to FIG. 12.

In Equation 49a, $P_{opt}$ are "optimal" DRC parameter values for the known DRC model 303 that best fit the output of the unknown DRC model 301. The output of the unknown DRC model 301 can then be approximated with that of the known DRC model 303 given the optimal parameters. The optimization algorithm could be based on any optimization method that can find a minimum of Equation 49a given that z(n) is nonlinear with respect to. P. An example is the Nelder-Mead method.

Figure 4:
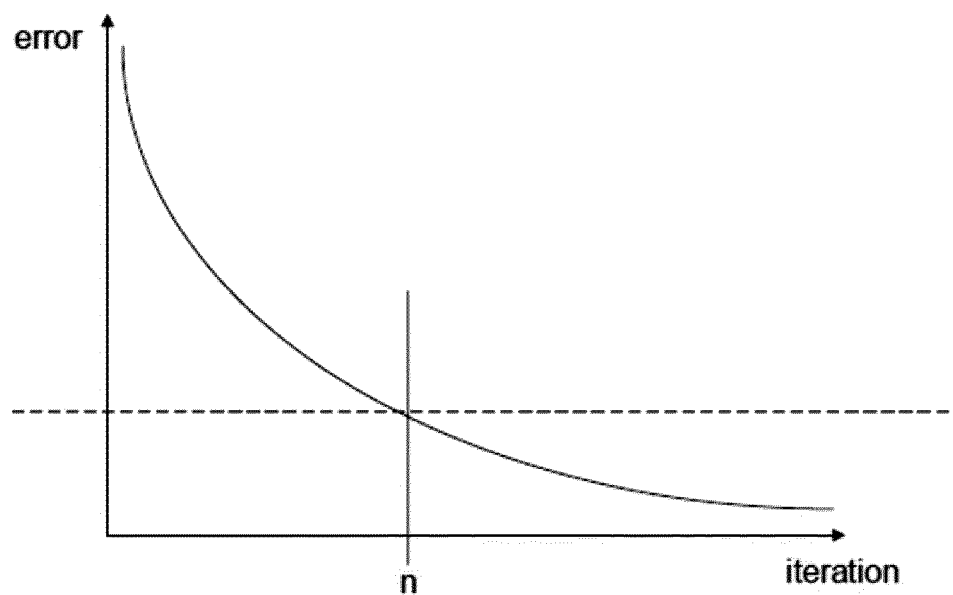
FIG. 4 is a graphical illustration of the distance between known and unknown dynamic range control output signals in FIG. 1.

FIG. 4 is a graph showing the distance between y(n) and z(n). More specifically, FIG. 4 illustrates the minimization of the distance function at each iteration until convergence is achieved. The convergence criterion is set as the value of the distance function falling below a threshold. Once the convergence criterion is met, the optimized DRC parameters are selected.

Figure 6:
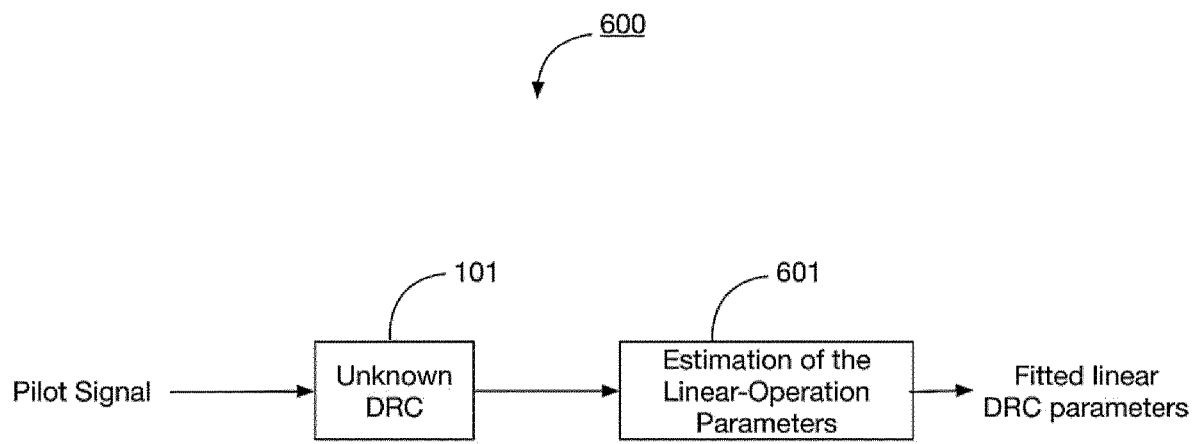
FIG. 6 illustrates a block diagram of employing a heuristic (rule-based) technique for identifying the parameters of a DRC model using a pilot signal in accordance with example embodiments of the present disclosure.

Referring to FIG. 6, it presents a system for the heuristic (rule-based) parameter identification for dynamic range compression (DRC) using a pilot signal (300). That is, the pilot signal may be used as the first audio signal. The pilot signal may be used for determining the first set of parameters for use by the first DRC model.

The pilot signal should comply with the following specifications:

There must exist nonnegative envelope values below the DRC threshold (knee value).

There should exist at least one envelope value that is equal to the DRC threshold (knee value).

There should exist an envelope that has a "plateau" above the DRC threshold (knee value).

The size (e.g., duration) of the plateau should be longer than the DRC attack time constant.

There must exist a series of steadily increasing envelope values (e.g., a segment with steadily increasing envelope values).

There must exist a series of steadily decreasing envelope values (e.g., a segment with steadily decreasing envelope values).

Figure 5:
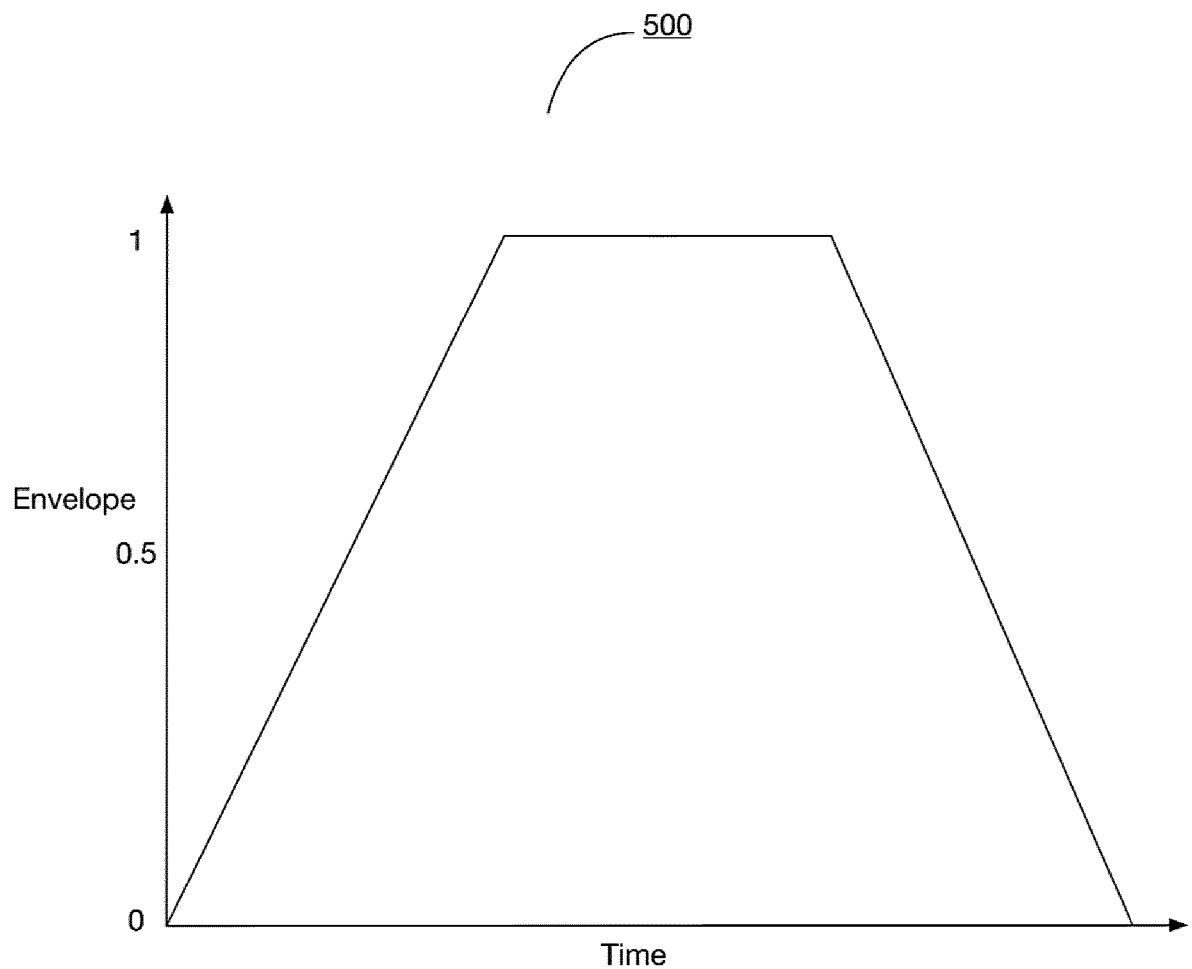
FIG. 5 is a graphical illustration of an example pilot signal, or more specifically its envelope, employed in FIG. 3.

Natural audio signals may not fulfill all these characteristics. Thus, a sensible pilot signal that fulfills the above criteria is desired. A pilot signal that meets these criteria is shown in FIG. 5.

The object of the discovery process shown in FIG. 6 is to determine an unknown DRC system 301. The pilot signal is compressed by the unknown DRC system 301. The block 601 then analyze the compressed signal to estimate the unknown DRC linear-operation parameters.

Linear Operation

The make-up gain can be estimated from the compressed pilot signal using Equation 32 as following:

$$M=\max\{Z(n)\} \quad \text{(Equation No. 50)}$$

The threshold can be estimated as:

$$T=\max\{V(m)\}, m \in M_T \quad \text{(Equation No. 51)}$$

$$M_T=\{n \in \mathbb{N} : X(n)<M\}. \quad \text{(Equation No. 52)}$$

Figure 7:
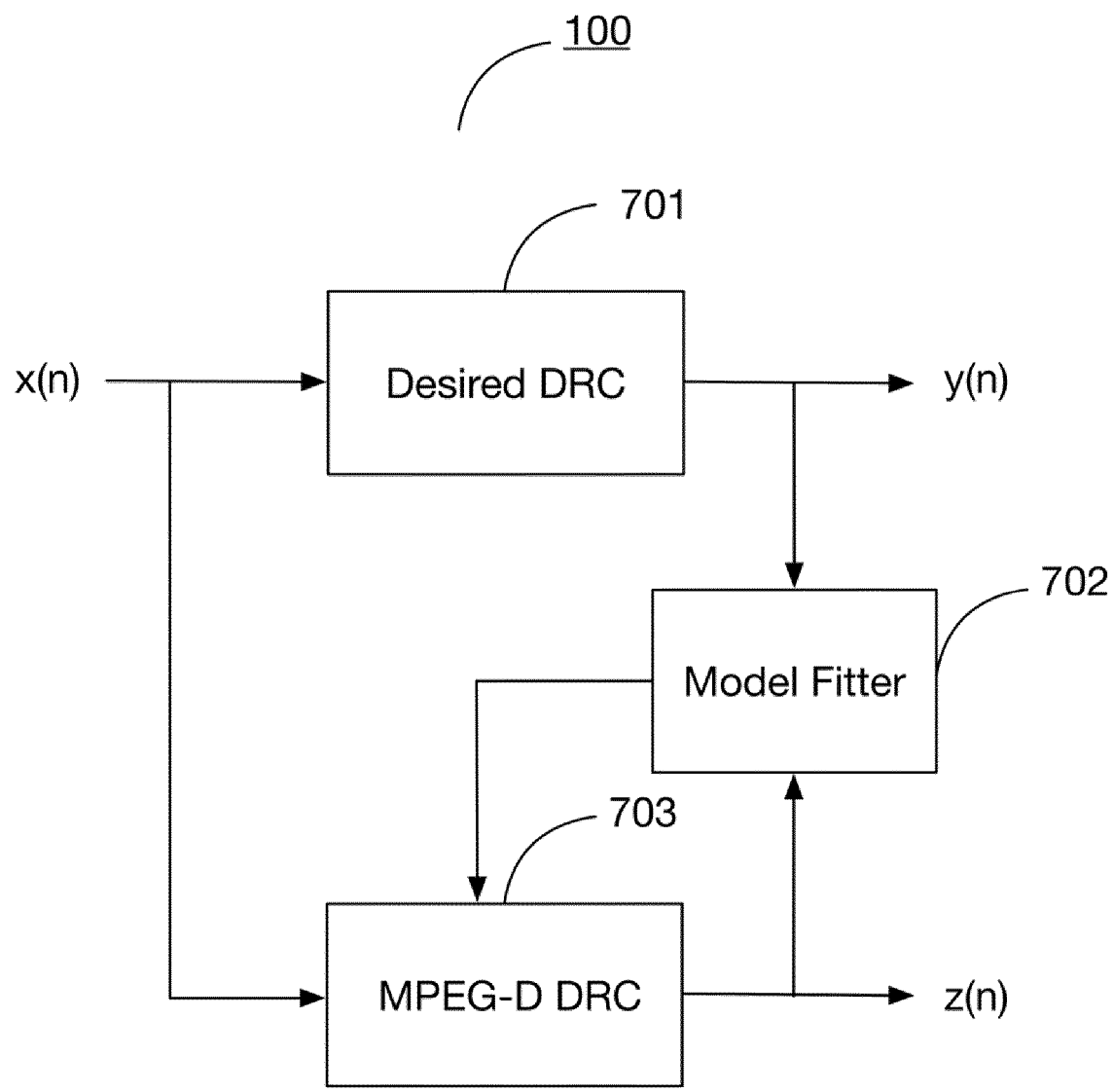
FIG. 7 illustrates a block diagram of a system for fitting the output of a desired DRC model using the MPEG-D DRC model and an arbitrary audio signal in accordance with example embodiments of the present disclosure.

Referring to FIG. 7, a system for identifying the parameters of a custom (e.g. unknown, etc.) DRC model in an encoder by adjusting the parameters of a known model, for example, the DRC model in MPEG-D DRC, that best fits the output of an unknown DRC model, which serves as a reference as shown in (700). An uncompressed signal, x(n), is compressed with a custom DRC model (701), resulting in a compressed signal, y(n). The model fitter (702) then adjusts the MPEG-D DRC model parameters for example until the distance between z(n) and y(n) is less than a small threshold (i.e. to achieve convergence). The MPEG-D DRC parameters (e.g., DRC metadata in the encoder) that achieve convergence are assigned as the optimal parameters for the MPEG-D DRC model decoder. These DRC parameters can then be stored or transmitted as DRC metadata.

In general, the present disclosure proposes a method of determining the parameters for use by a first (known) DRC model. Parameters of the first set of parameters can be determined as described above, i.e., based on one or more pairs of samples that have been selected based on one or more rules (e.g., a set of rules). An approach for determining the parameters of the second set of parameters based on the one or more pairs of samples has been described above as well. Alternatively, an approach for determining the parameters of the second set of samples as illustrated in FIG. 12 could be pursued. In this approach, the second set of parameters is determined (e.g., estimated) by minimizing a distance function between a dynamic range controlled audio signal output by the first DRC model and a reference audio signal. The reference signal may be an audio signal output by the second DRC model. Since the first set of parameters is determined based on rule-based selection of pairs of samples whereas the second set of parameters is determined using an (e.g., iterative) approach for minimizing an error function, the present approach can be referred to as a hybrid approach.

In more detail, at step S1210, a third audio signal is fed to the second DRC model and a fourth audio signal is received from the second DRC model in response. The third audio signal may be an arbitrary audio signal, such as an audio recording, a music signal or a speech signal, for example. Then, an iteration loop is entered that comprises steps S1220, S1230, and S1240. At step S1220, the third audio signal is fed to the first DRC model and a fifth audio signal is received from the first DRC model in response. Then, using the parameters of the first set of parameters (e.g., by fixing these parameters to their values determined as described above), the parameters of the second set of parameters are adjusted to minimize a distance function between the fourth audio signal and the fifth audio signal. The distance function may be any one of the distance functions described above, for example. At step S1240, it is determined (e.g., checked) whether an end condition for exiting the iteration loop is satisfied. The end condition may relate to, for example, a threshold for the distance function that the distance function has fallen below, or a maximum number of iterations having been reached. Alterative end conditions are feasible as well. Thereby, the parameters of the second set of parameters can be determined, for example, the parameters of the second set of parameters can be set to their respective values after the last run of the iteration loop.

The parameters for use by the first DRC model that have been determined as described above can then be used to reverse dynamic range control for a dynamic range controlled signal, in the manner described above. One field of application of such reversion of DRC is declipping. Accordingly, the present disclosure proposes a method of declipping a clipped audio signal that has been clipped by a DRC model. The method comprises receiving the clipped audio signal. The method further comprises determining parameters of the DRC model that have been used for clipping the clipped audio signal. This may be done in the manner described above, for example, based on selected pairs of samples, or using the hybrid approach. The method further comprises increasing the dynamic range of the clipped audio signal (e.g., declipping) based on the determined parameters of the DRC model. This may result in restoring (or at least approximating) the original waveform of the clipped audio signal before clipping. This increase of dynamic range may proceed along the lines of the above-described DRC reversion.

Figure 8:
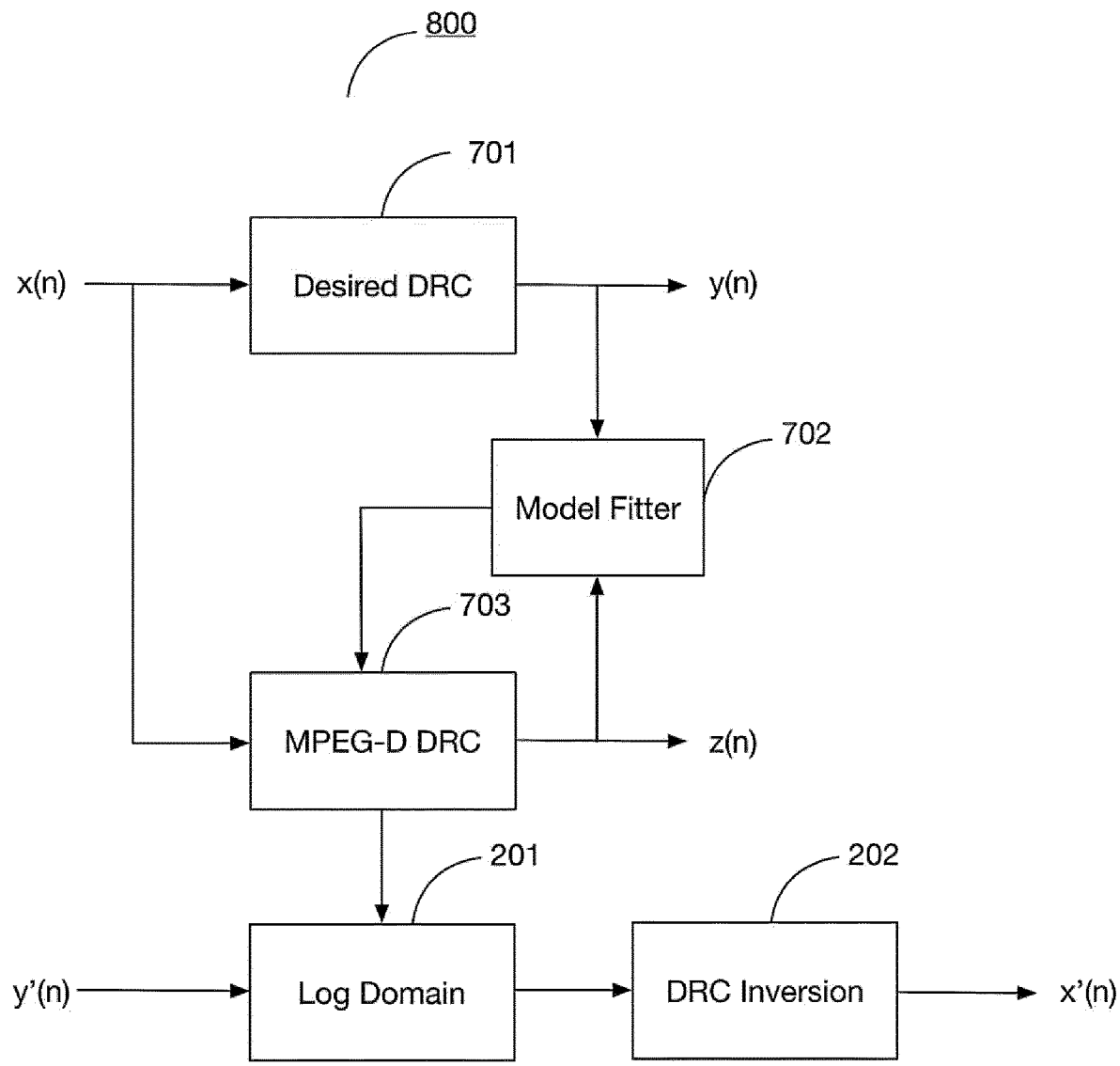
FIG. 8 illustrates a block diagram of a system for restoring a waveform subject to a higher dynamic range, in accordance with example embodiments of the present disclosure.

FIG. 8 shows a system for generating a waveform with an increased dynamic range in MPEG-D DRC decoder using an arbitrary audio signal (800). The estimated and/or stored parameters in the MPEG-D DRC encoder from FIG. 7 can then be used to increase the dynamic range (801) of a previously compressed waveform in the decoder, y'(n), that has been compressed by the DRC of 701, if desired.

Figure 9:
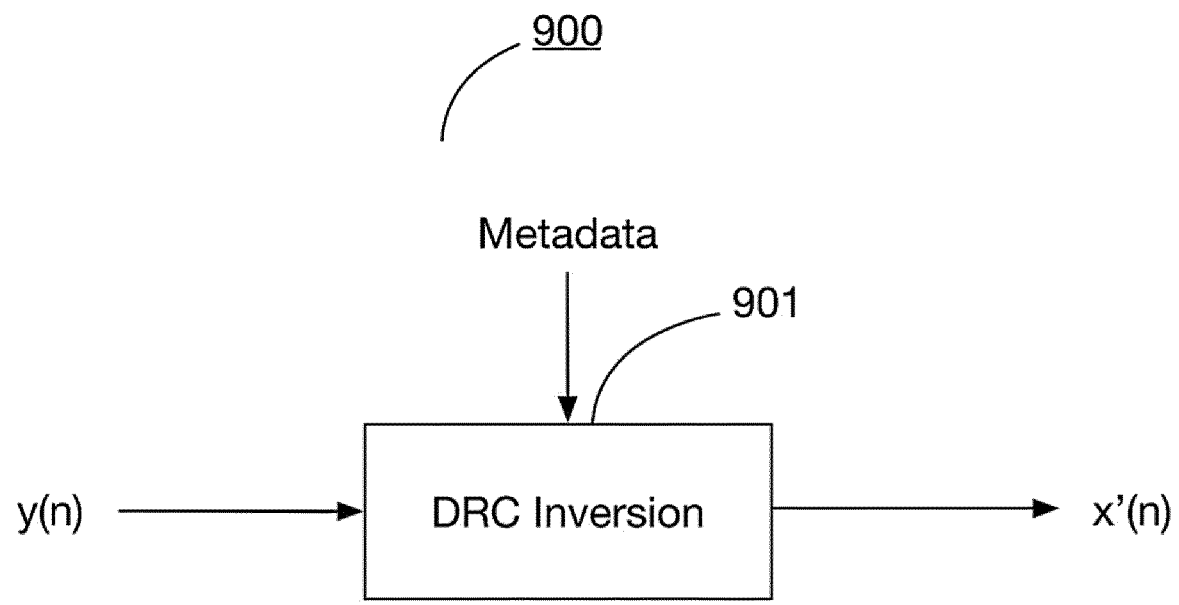
FIG. 9 illustrates a block diagram of a system for restoring a waveform subject to using information stored as metadata, in accordance with example embodiments of the present disclosure.

Referring to FIG. 9, a system for generating a waveform of higher dynamic range for example in MPEG-D as metadata such as peak values (e.g., the DRC tool in MPEG-D DRC support transmission of optional peak values discussed in section G.2.4 of ISO/IEC 23003-4:2015(E)) using the same methods discussed earlier. The only restriction here is that the DRC model of the compressed, limited, or clipped recording is approximated using the DRC model discussed in the example embodiment. The DRC model parameters are fixed to represent a brick-wall limiter. In the brick-wall limiter all parameters apart from threshold value or the make-up gain are fixed to leave one degree of freedom. Using only the peak level, either the threshold or the make-up gain can be estimated. The DRC model can then be transmitted as if all the parameters were explicitly transmitted alongside the compressed signal. For example, this technique can be used to accentuate the transients in a compressed signal using only the information about the original peak level.

Specifically, in accordance with an example embodiments, the processes described above regarding FIG. 2 may be implemented as a computer program. For example, the example embodiment includes a computer program product including a computer program tangibly embodied on a machine-readable medium and the computer program including program code for performing the method 200. In such embodiments, the computer program may be downloaded and mounted from the network via the communication unit 409, and/or installed from the removable medium 411.

Unless indicated otherwise, the above formulae relate to the case of downward-compression (downward knee static gain function). However, the present disclosure is equally applicable to upward-compression (i.e., expansion), with obvious modifications to the equations that the skilled person would readily perform.

Generally speaking, various example embodiments of the present invention may be implemented in hardware or special purpose circuits, software, logic or any combination thereof. Some aspects may be implemented in hardware, while other aspects may be implemented in firmware or software which may be executed by a controller, microprocessor or other computing device. While various aspects of the example embodiments of the present invention are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller, or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, embodiments of the present invention include a computer program product comprising a computer program tangibly embodied on a machine readable medium, in which the computer program containing program codes configured to carry out the methods as described above.

In the context of the disclosure, a machine readable medium may be any tangible medium that may contain, or store, a program for use by or in connection with an instruction execution system, apparatus, or device. The machine readable medium may be a machine readable signal medium or a machine readable storage medium. A machine readable medium may include but is not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out methods of the present invention may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server. The program code may also be distributed on specially-programmed devices which may be generally referred to herein as "modules". Software component portions of the modules may be written in any computer language and may be a portion of a monolithic code base, or may be developed in more discrete code portions, such as is typical in object-oriented computer languages. In addition, the modules may be distributed across a plurality of computer platforms, servers, terminals, mobile devices and the like. A given module may even be implemented such that the described functions are performed by separate processors and/or computing hardware platforms.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of any invention, or of what may be claimed, but rather as descriptions of features that may be specific to particular embodiments of particular inventions. Certain features that are described in this specification in the context of separate embodiments may also may be implemented in combination in a single embodiment. Conversely, various features that are described in the context of a single embodiment may also may be implemented in multiple embodiments separately or in any suitable sub-combination.

Various modifications, adaptations to the foregoing example embodiments of this invention may become apparent to those skilled in the relevant arts in view of the foregoing description, when read in conjunction with the accompanying drawings. Any and all modifications will still fall within the scope of the non-limiting and example embodiments of this invention. Furthermore, other embodiments of the inventions set forth herein will come to mind to one skilled in the art to which these embodiments of the invention pertain having the benefit of the teachings presented in the foregoing descriptions and the drawings.

Enumerated exemplary embodiments of the disclosure relate to:

EEE1: A method for decompressing, delimiting, and declipping a compressed, limited, or clipped audio signal, the method comprising: receiving a compressed or limited or clipped audio signal; receiving parameters of a known dynamic range control model for the corresponding compressed or limited or clipped audio signal; restoring the original waveform or at least increasing the dynamic range of the compressed, limited, or clipped audio signal (e.g., decompressing, delimiting, or declipping).

EEE2: The method of EEE1, wherein the restoration is performed in the logarithmic domain.

EEE3: The method of EEE1, wherein the solution to the restoration is closed-form.

EEE4: The method of EEE1, wherein the compressed or limited or clipped audio signal is modelled as a multiplication between the original input signal and a time-varying, input signal dependent, control signal.

EEE5: The method of EEE1, wherein an envelope of the compressed signal is detected.

EEE6: The method of EEE1, wherein a decompressed or delimited or declipped audio signal is calculated as the multiplication of a sign function of the compressed or limited or clipped audio signal by an approximation of the envelope of the decompressed or delimited or declipped audio signal.

EEE7: The method of EEE1, wherein the compressed or limited audio signal is expressed as a characteristic function of the envelope, a piecewise gain function, gain smoothing, and a make-up gain in the log domain.

EEE8: The method of EEE4, wherein the control signal is defined as an addition of the smoothed gain function with the make-up gain.

EEE9: The method of EEE5, wherein the smoothed gain function is calculated as an exponentially weighted moving average of the piecewise function in the logarithmic domain.

EEE10: The method of EEE1, wherein the dynamic range control model is a soft-knee model.

EEE11: The method of EEE1, whereby if the DRC model is known (e.g., the DRC model described in the present disclosure), the waveform of the original audio signal can be recovered with high precision by inversion of the DRC operation.

EEE12: The method of EEE11, wherein the solution to the DRC inversion operation is a closed-form solution.

EEE13: The method of EEE11, wherein the solution of DRC model reversion is a closed form solution.

EEE14: The method of EEE1, wherein if the dynamic range model and parameters are unknown, the transients of compressed, limited, or clipped recording can be partially recovered by conveying the peak levels of the original audio signal in the form of metadata.

EEE15: The method of EEE1, wherein decompressing, delimiting, or declipping is performed in one or multiple bands.

EEE16: A method for identifying an unknown dynamic range control system, the method comprising: feeding an audio signal to the unknown dynamic range control system; feeding the audio signal to a known dynamic range control system; adjusting the parameters of the known dynamic range control model until a distance function is minimized; and determining the parameters of the unknown dynamic range.

EEE17: The method of EEE16, wherein the dynamic range control parameters comprise: a make-up gain, a threshold value, a compression ratio, an attack time constant, a release time constant, and knee-width.

EEE18: The method of EEE16, wherein a pilot signal is used as the input signal to identify the linear operation parameters.

EEE19: The method of EEE16, wherein an arbitrary audio signal is used as the input signal to identify the non-linear operation parameters.

EEE20: The method of EEE17, wherein the make-up gain is estimated as the maximum of a difference signal in the logarithmic domain.

EEE21: The method of EEE20, wherein the difference signal is the envelope signal subtracted from the compressed signal.

EEE22: The method of EEE17, wherein a smoothed gain function is calculated as the difference between the difference signal and the make-up gain in the logarithmic domain.

EEE23: The method of EEE17, wherein the threshold is calculated as the maximum of an envelope signal in the logarithmic domain given that the smoothed gain function is zero.

EEE24: The method of EEE16, wherein the distance function can be, for example, the Euclidean, the Taxicab, or the Chebyshev distance between the compressed signal from the unknown dynamic range control model and the compressed signal from the known dynamic range control model.

EEE25: The method of EEE23, wherein the envelope signal is calculated as the logarithm of the absolute value of the input signal.

EEE26: The method of EEE17, wherein the compression ratio is calculated when the envelope signal exceeds the threshold.

EEE27: The method of EEE17, wherein the attack time constant is translated to an attack smoothing factor.

EEE28: The method of EEE17, wherein the release time constant is translated to a release smoothing factor.

EEE29: The method of EEE18, wherein the pilot signal features: at least one nonnegative envelope value below the threshold; at least one envelope value that is equal to the threshold; an envelope signal with a plateau above the threshold value, whereby the plateau duration is longer than the attack time constant; a segment with steadily increasing envelope values; and a segment with steadily decreasing envelope values.

EEE30: A method for identifying a known dynamic range control model with unknown parameter values, the method comprising a rule-based (e.g., heuristic) technique.

EEE31: The method of EEE28, wherein the linear operation parameters are the make-up gain and the threshold and non-linear operation parameters are the compression ratio, the attack time constant, the release time constant, and the knee width.

EEE32: The method of EEE29, wherein the non-linear parameters are obtained using an arbitrary audio signal.

EEE33: The method of EEE29, wherein the make-up gain is calculated as the maximum of a difference signal in the logarithmic domain.

EEE34: The method of EEE29, wherein the threshold is calculated as the maximum of the envelope values in the logarithmic domain for which the difference signal is strictly smaller than the make-up gain.

EEE35: The method of EEE29, wherein the compression ratio, the attack time constant, and the release time constant are found by minimizing a distance function between the compressed signal and a reference signal.

EEE36: The method of EEE29, wherein the attack smoothing factor is computed as function of the smoothed gain function and a piecewise gain function in the logarithmic domain if the envelope value crosses the threshold or if the piecewise gain function becomes smaller than the smoothed gain function in the previous sample.

EEE37: The method of EEE29, wherein the release smoothing factor is computed as function of the smoothed gain function and a piecewise gain function in the logarithmic domain if the envelope value is smaller than the threshold or if the piecewise gain function becomes larger than the smoothed gain function in the previous sample.

EEE38: The method of EEE33, wherein the distance function is the Euclidean distance, the Taxicab distance, or the Chebyshev distance.

EEE39: The method of EEE33, wherein the Nelder-Mead method is employed for finding a minimum of the distance function.

EEE40: A method for increasing the dynamic range of compressed audio signals, the method comprising: receiving a compressed input signal; receiving a compressed signal and its corresponding uncompressed signal; estimating dynamic range compression parameters; increasing the dynamic range of an arbitrary compressed audio signal.

EEE41: A computer-readable storage medium having stored thereon instructions that, when executed by a processor, cause the processor to perform the method of any one of the preceding EEEs.

The invention claimed is:

1. A method of determining model parameters for use by a first dynamic range control, DRC, model, the method comprising:

feeding a first audio signal, being an input audio signal, to a second DRC model and receiving a second audio signal from the second DRC model, the second audio signal being a dynamic range controlled version of the first audio signal;

rule-based selecting one or more pairs of samples, each pair of samples including a sample of the first audio signal and a corresponding sample of the second audio signal;

determining parameters of a first set of parameters among the parameters for use by the first DRC model based on the one or more selected pairs of samples, wherein the first set of parameters includes linear operation parameters of the first DRC model, wherein the first DRC model is a soft-knee DRC model or a hard-knee DRC model and is defined by a control value that is applied to an envelope of the input audio signal; and wherein the control value comprises a constant gain portion and a variable gain portion.

2. The method according to claim 1, wherein the rule-based selecting the one or more pairs of samples involves at least one of:

selecting a pair of samples that has an extremal value of a difference between a value of the sample of the second audio signal in the pair and a value of the sample of the first audio signal in the pair;

selecting a pair of samples for which the value of the sample of the first audio signal in the pair has a value below a first threshold;

selecting a pair of samples for which the value of the sample of the first audio signal in the pair has a value above a second threshold; and selecting a pair of samples, which is that pair of samples that has the maximum value of the sample of the first audio signal for which a variable gain portion is zero.

3. The method according to claim 1, wherein the rule-based selecting the one or more pairs of samples involves selecting a first pair of samples that has an extremal value of a difference between a value of the sample of the second audio signal in the pair and a value of the sample of the first audio signal in the pair; and wherein the determining the parameters of the first set of parameters involves determining the constant gain portion based on said extremal value.

4. The method according to claim 1, wherein the variable gain portion comprises a static gain function that has a first linear portion below a knee value and a second linear portion above the knee value; wherein the rule-based selecting the one or more pairs of samples involves selecting a second pair of samples for which the value of the sample of the first audio signal in the pair has a value below a first threshold, and selecting a third pair of samples for which the value of the sample of the first audio signal in the pair has a value above a second threshold; wherein the determining the parameters of the first set of parameters involves: calculating a first slope of said first linear portion based on the second pair of samples; calculating a second slope of said second linear portion based on the third pair of samples; and determining the knee value based on the first slope and the second slope.

5. The method according to any one of claim 1, further comprising: determining parameters of a second set of parameters among the parameters for use by the first DRC model based on the one or more selected pairs of samples, wherein the second set of parameters comprises the remaining ones of the parameters for use by the first DRC model that are not contained in the first set of parameters, and wherein the second set of parameters includes non-linear operation parameters of the first DRC model, wherein the rule-based selecting the one or more pairs of samples involves selecting a fourth pair of samples, which is that pair of samples that has the maximum value of the sample of the first audio signal for which the variable gain portion is zero; and wherein the determining the parameters of the second set of parameters involves: determining a knee width based on the value of the sample of the first audio signal in the fourth pair of samples.

6. The method according to claim 4,
wherein the variable gain portion is given by a smoothed gain function that is obtained, for each sample of the first audio signal, as a weighted sum of the static gain function and a value of the smoothed gain function for the preceding sample of the first audio signal;
wherein the rule-based selecting the one or more pairs of samples involves selecting a fifth pair of samples for which the value of the sample of the first audio signal is larger than the knee value and for which the value of the smoothed gain function is substantially equal to the value of the smoothed gain function for the preceding sample of the first audio signal; and
wherein the determining the parameters of the second set of parameters involves:
determining the second slope based on the value of the sample of the first audio signal in the fifth pair of samples and the value of the smoothed gain function for the sample of the first audio signal in the fifth pair of samples.

7. The method according to claim 6,
wherein the rule-based selecting the one or more pairs of samples involves selecting a sixth pair of samples for which the value of the smoothed gain function for the preceding sample of the first audio signal is substantially zero and for which the value of the smoothed gain function is smaller than the value of the smoothed gain function for the preceding sample of the first audio signal; and
wherein the determining the parameters of the second set of parameters involves:
determining a first smoothing factor based on the value of the static gain function for the sample of the first audio signal in the sixth pair of samples and the value of the smoothed gain function for the sample of the first audio signal in the sixth pair of samples.

8. The method according to claim 6,
wherein the rule-based selecting the one or more pairs of samples involves selecting a seventh pair of samples for which the value of the envelope of the first audio signal is larger than or equal to the knee value and the static gain function for the sample of the first audio signal is larger than or equal to the value of the smoothed gain function for the preceding sample of the first audio signal; and
wherein the determining the parameters of the second set of parameters involves:
determining a second smoothing factor based on the value of the static gain function for the sample of the first audio signal in the seventh pair of samples, the value of the smoothed gain function for the sample of the first audio signal in the seventh pair of samples, and the value of the smoothed gain function for the preceding sample of the first audio signal.

9. The method according to claim 1, wherein a pilot signal is used as the first audio signal and wherein the pilot signal comprises:
at least one nonnegative envelope value below a knee value of the first DRC model;
at least one envelope value that is equal to the knee value;
an envelope signal with a plateau above the knee value, wherein a duration of the plateau is longer than an attack time constant of the first DRC model;
a segment with steadily increasing envelope values; and
a segment with steadily decreasing envelope values.

10. The method according to claim 1, further comprising:
determining a second set of parameters among the parameters for use by the first DRC model, wherein the second set of parameters comprises the remaining ones of the parameters for use by the first DRC model that are not contained in the first set of parameters, and wherein the second set of parameters includes non-linear operation parameters of the first DRC model,
wherein the determining the second set of parameters involves:
minimizing a distance function between a dynamic range controlled audio signal output by the first DRC model and a reference audio signal.

11. The method according to claim 1, further comprising determining a second set of parameters among the parameters for use by the first DRC model, wherein the second set of parameters comprises the remaining ones of the parameters for use by the first DRC model that are not contained in the first set of parameters, and wherein the second set of parameters includes non-linear operation parameters of the first DRC model,
wherein determining the second set of parameters involves repeatedly feeding a third audio signal, being an arbitrary audio signal, to the first DRC model using the determined parameters of the first set of parameters, and, for each resulting audio signal received from the first DRC model, comparing the resulting audio signal received from the first DRC model to a reference audio signal and adjusting the parameters of the second set of parameters to minimize a distance function between the resulting audio signal received from the first DRC model and the reference audio signal, wherein the reference audio signal is obtained by feeding the third audio signal to the second DRC model.

12. The method according to claim 9, further comprising:
determining a second set of parameters among the parameters for use by the first DRC model, wherein the second set of parameters comprises the remaining ones of the parameters for use by the first DRC model that are not contained in the first set of parameters, and wherein the second set of parameters includes non-linear operation parameters of the first DRC model, wherein the determining the second set of parameters involves:

feeding a third audio signal, being an arbitrary audio signal, to the second DRC model and receiving a fourth audio signal from the second DRC model, the fourth audio signal being a dynamic range controlled version of the third audio signal;

repeatedly feeding the third audio signal to the first DRC model and receiving a fifth audio signal from the first DRC model, the fifth audio signal being a dynamic range controlled version of the third audio signal; and in the repeatedly feeding the third audio signal to the first DRC model, using the determined parameters of the first set of parameters and adjusting the parameters of the second set of parameters to minimize a distance function between the fourth audio signal and the fifth audio signal.

13. The method according to claim 1, further comprising reversing the DRC of a dynamic range controlled audio signal by estimating an input audio signal that would yield the dynamic range controlled audio signal when being fed to the first DRC model using the determined parameters for use by the first DRC model, wherein the first DRC model is defined by a control value that is applied to an envelope of the input audio signal, and wherein the control value comprises a piece-wise defined static gain function, wherein the reversing the DRC of the dynamic range controlled audio signal involves:

receiving, as input, the dynamic range controlled audio signal; and for each sample of the dynamic range controlled signal:

estimating an envelope of the input audio signal;

determining, based on the estimated envelope, a piece of the static gain function that relates to the estimated envelope;

determining a characteristic function for the determined piece of the static gain function, wherein the characteristic function for the determined piece of the static gain function is a polynomial function of the envelope of the input audio signal and depends on one or more of the determined parameters for use by the first DRC model; and determining the envelope of the input audio signal based on the characteristic function.

14. A method of declipping a clipped audio signal that has been clipped by a dynamic range control, DRC, model, the method comprising:

receiving the clipped audio signal;

determining parameters of the DRC model that have been used for clipping the clipped audio signal;

increasing the dynamic range of the clipped audio signal based on the determined parameters of the DRC model, wherein the DRC model is a soft-knee DRC model or a hard-knee DRC model and is defined by a control value that is applied to an envelope of an input audio signal; and wherein the control value comprises a constant gain portion and a variable gain portion.

15. A method of reversing dynamic range control, DRC, of a dynamic range controlled audio signal by estimating an input audio signal that would yield the dynamic range controlled audio signal when being fed to a DRC model using a set of parameters, wherein the DRC model is a soft-knee DRC model or a hard-knee DRC model and is defined by a control value that is applied to an envelope of the input audio signal, and wherein the control value comprises a static gain function, the method comprising:

receiving, as inputs, the dynamic range controlled audio signal and the set of parameters of the DRC model; and for each sample of the dynamic range controlled signal:

determining a characteristic function for the static gain function, wherein the characteristic function for the static gain function is a polynomial function of the envelope of the input audio signal and depends on one or more of the set of parameters of the DRC model; and determining the envelope of the input audio signal based on the characteristic function.

16. The method according to claim 15, wherein the static gain function is a piece-wise defined static gain function;

wherein the method further comprises, for each sample of the dynamic range controlled signal:

estimating an envelope of the input audio signal; and determining, based on the estimated envelope, a piece of the static gain function that relates to the estimated envelope; and wherein the characteristic function for the static gain function is a characteristic function for the determined piece of the static gain function.

17. An apparatus comprising a processor and a memory coupled to the processor, the memory storing instructions that are executable by the processor, the processor being configured to perform the method of claim 1.

18. A non-transitory computer-readable storage medium having stored thereon instructions that, when executed by a processor, cause the processor to perform the method of claim 1.

* * * * *